US012652764B2

(12) United States Patent
Cho et al.

(10) Patent No.: US 12,652,764 B2
(45) Date of Patent: Jun. 9, 2026

(54) SLIDABLE HOUSING INCLUDING DRIVE MOTOR AND ELECTRONIC DEVICE INCLUDING THE SAME

(71) Applicant: SAMSUNG ELECTRONICS CO., LTD., Suwon-si (KR)

(72) Inventors: Hyoungtak Cho, Suwon-si (KR); Junyoung Choi, Suwon-si (KR); Hyunggwang Kang, Suwon-si (KR); Wonho Lee, Suwon-si (KR); Hojin Jung, Suwon-si (KR); Hyunju Hong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 168 days.

(21) Appl. No.: 18/443,641

(22) Filed: Feb. 16, 2024

(65) Prior Publication Data

US 2024/0188238 A1     Jun. 6, 2024

Related U.S. Application Data

(63) Continuation of application No. PCT/KR2022/010712, filed on Jul. 21, 2022.

(30) Foreign Application Priority Data

Aug. 24, 2021     (KR) ........................ 10-2021-0111851

(51) Int. Cl.
 *G06F 1/16*          (2006.01)
 *H02K 7/06*          (2006.01)
           (Continued)

(52) U.S. Cl.
 CPC ............. *H05K 5/0217* (2013.01); *H02K 7/06* (2013.01); *H04M 1/026* (2013.01)

(58) Field of Classification Search
 CPC .. G06F 1/1624; G06F 1/1652; H04M 1/0268; H04M 1/0237; G09F 9/30
 See application file for complete search history.

(56) References Cited

U.S. PATENT DOCUMENTS 10,747,269 B1     8/2020  Choi et al.
2013/0058063 A1   3/2013  OBrien
                  (Continued)

FOREIGN PATENT DOCUMENTS

CN        112866451 A     5/2021
KR      20140059274 A     5/2014
                  (Continued)

OTHER PUBLICATIONS

Extended European Search Report dated Oct. 10, 2024 of the European Patent No. 22861558.9.

*Primary Examiner* — Anthony Q Edwards
(74) *Attorney, Agent, or Firm* — CANTOR COLBURN LLP

(57) ABSTRACT

According to various embodiments, an electronic device may comprise: a first housing; a second housing which is slidably coupled to the first housing; a flexible display which is expanded or reduced on the basis of a slide-out or slide-in movement of the first housing; a support member which supports at least a part of the flexible display and is disposed at the rear surface of the flexible display; at least one drive motor which is disposed in the first housing, is fixed by at least one bracket, and includes a first gear; and a second gear which is disposed in the second housing and is arranged to be meshed with the first gear, wherein the first housing is configured to be slid in or slid out on the basis that the first gear and the second gear are driven in mesh with each other during driving of the drive motor.

20 Claims, 35 Drawing Sheets

(51) Int. Cl.
    *H05K 5/02*       (2006.01)
    *H04M 1/02*       (2006.01)

(56)               References Cited

U.S. PATENT DOCUMENTS

| | | | | |
|---|---|---|---|---|
| 2017/0164080 | A1 | 6/2017 | Chung et al. | |
| 2020/0253063 | A1 | 8/2020 | Jiang | |
| 2020/0264660 | A1 | 8/2020 | Song et al. | |
| 2020/0267246 | A1 | 8/2020 | Song et al. | |
| 2020/0363841 | A1 | 11/2020 | Kim et al. | |
| 2021/0181800 | A1 | 6/2021 | Ko et al. | |
| 2022/0026954 | A1* | 1/2022 | Choi | G06F 1/1652 |
| 2022/0035513 | A1* | 2/2022 | Kang | G06F 3/04842 |
| 2022/0038564 | A1 | 2/2022 | Li et al. | |
| 2022/0253103 | A1* | 8/2022 | Choi | G06F 1/1624 |
| 2023/0234338 | A1* | 7/2023 | Song | G09F 9/301 |
| 2023/0336646 | A1* | 10/2023 | Shim | H04M 1/0237 |
| 2024/0015237 | A1* | 1/2024 | Mun | G06F 1/16 |
| 2024/0195896 | A1* | 6/2024 | Lee | H04M 1/03 |
| 2024/0195897 | A1* | 6/2024 | Choi | G06F 1/1624 |
| 2024/0214478 | A1* | 6/2024 | Kim | H04M 1/0262 |

FOREIGN PATENT DOCUMENTS

| | | | |
|---|---|---|---|
| KR | 20160013289 | A | 2/2016 |
| KR | 20170067295 | A | 6/2017 |
| KR | 20200144822 | A | 12/2020 |
| KR | 20210068272 | A | 6/2021 |
| KR | 20210076492 | A | 6/2021 |
| WO | 2020211948 | A1 | 10/2020 |
| WO | 2020256183 | A1 | 12/2020 |
| WO | 2021015310 | A1 | 1/2021 |

\* cited by examiner

SLIDABLE HOUSING INCLUDING DRIVE MOTOR AND ELECTRONIC DEVICE INCLUDING THE SAME

CROSS-REFERENCE TO RELATED APPLICATIONS

This application is a continuation application of International Application No. PCT/KR2022/010712 designating the United States, filed on Jul. 21, 2022, in the Korean Intellectual Property Receiving Office and claiming priority to Korean Patent Application No. 10-2021-0111851, filed on Aug. 24, 2021, in the Korean Intellectual Property Office, the disclosures of which are incorporated by reference herein in their entireties.

BACKGROUND

(1) Field

Various embodiments of the disclosure relate to an electronic device including a drive motor.

(2) Description of the Related Art

Electronic devices are gradually decreasing in thickness and are being improved to increase rigidity thereof, to strengthen design aspects thereof, and to differentiate functional elements thereof. Electronic devices are gradually being transformed from a uniform rectangular shape into various shapes. The electronic device may have a transformable structure capable of using a large screen display while being convenient to carry. For example, as part of a transformable structure, the electronic device may have a structure (e.g., rollable structure or slidable structure) capable of varying dimensions of a visible display area of a flexible display through the support of housings operating in a sliding manner with respect to each other. The electronic device may include a drive motor capable of automatically sliding the housings relative to each other, and an efficient disposition structure of the drive motor needs to be secured.

SUMMARY

The electronic device may include a rollable electronic device (e.g., slidable electronic device) in which a display area of a flexible display may be expanded and/or reduced. The rollable electronic device may include a first housing (e.g., first housing structure, base housing, base bracket, fixing part, or base structure) and a second housing (e.g., second housing structure, slide housing, slide bracket, moving part, or slide structure) coupled to each other so as to be movable with respect to each other in at least a partially fitted together manner. For example, the first housing and the second housing may slidably operate with respect to each other, and support at least a portion of the flexible display (e.g., expandable display or stretchable display), thereby inducing the flexible display to have a first display area in a slide-in state and inducing the flexible display to have a second display area larger than the first display area in a slide-out state.

The electronic device may include a drive motor disposed in an internal space and for operating to automatically slide the second housing from the first housing. The drive motor may include a pinion gear, and the pinion gear may include a rack gear disposed in the second housing and gear-coupled to the pinion gear. When the pinion gear rotates through the gear support member, for example, the drive motor, the rack gear gear-coupled to the pinion gear moves, thus, the gear support member and the second housing may be moved to a designated reciprocating distance.

However, when the drive motor operates, in order to provide a stable driving force, the drive motor may be fixed to the first housing through a symmetrical fixing bracket, thereby deteriorating disposition efficiency of peripheral electronic components (e.g., battery or substrate) according to an installation space of the drive motor. Further, because the pinion gear and the rack gear are disposed in an internal space of the electronic device in a structure in which only the pinion gear and the rack gear are gear-coupled without a coupling structure of a module unit of the pinion gear and the rack gear of the drive motor, an operation thereof may be unstable. Further, frictional resistance may increase by surface to surface contact due to a sliding structure of the two housings, thus, an efficiency loss of the drive motor may be large.

Various embodiments of the disclosure may provide an electronic device including a drive motor disposition structure capable of contributing to decrease in thickness of the electronic device.

Various embodiments may provide an electronic device including a structure capable of inducing a stable operation of a pinion gear and a rack gear gear-coupled to each other.

Various embodiments may provide an electronic device including a structure capable of reducing an efficiency loss of a drive motor by reducing frictional resistance during sliding.

However, problems to be solved in the disclosure are not limited to the above-mentioned problems, and may be variously extended without departing from the spirit and scope of the disclosure.

According to various embodiments, an electronic device may include a first housing, a second housing slidably coupled to the first housing, a flexible display configured to expand or contract based on a sliding-out or slide-in movement of the first housing, a support member configured to support at least a portion of the flexible display and disposed at a rear surface of the flexible display, at least one drive motor disposed in the first housing, fixed by at least one bracket, and including a first gear, and a second gear disposed in the second housing and disposed to engage with the first gear, where the first housing may be configured to slide-in or slide-out based on the first gear and the second gear being driven with engaged with each other when the drive motor is driven.

According to various embodiments, an electronic device may include a first housing, a second housing slidably coupled to the first housing, a flexible display configured to expand or contract based on a sliding-out or slide-in movement of the first housing, a support member configured to support at least a portion of the flexible display and disposed at a rear surface of the flexible display, at least one drive motor disposed in the first housing, fixed by at least one bracket, and including a first gear, and a gear support member disposed in the second housing and including a second gear disposed to engage with the first gear, where the drive motor may be fixed in at least two different directions through the at least one bracket, and the gear support member may be slidably coupled to the at least one bracket.

According to various embodiments, an electronic device may include a first housing including a first space, a second housing slidably coupled to the first housing and including a second space connected to the first space, a flexible display connected to the first housing according to a sliding movement of the second housing and having a slide-in state at least partially received in the second space or a slide-out state at least partially withdrawn from the second space, and a drive motor disposed in at least a portion of a first section in which a portion visible from the outside of the flexible display and a portion entered into the second space to be invisible from the outside are overlapped, when the flexible display is viewed from above, in the slide-in state, and configured to drive the second housing to be slidable from the first housing.

An electronic device according to embodiments of the disclosure has a fixed structure in which a drive motor is fixed in series through a motor bracket at a side surface of a bracket housing, thereby helping decrease in thickness of the electronic device. Further, since a guide structure for guiding a gear support member through the motor bracket is provided, a stable operation can be induced, and frictional resistance is reduced through a friction reduction structure disposed between the motor bracket and the gear support member, thereby helping to reduce an efficiency loss of the drive motor.

Further, various effects identified directly or indirectly through this document can be provided.

BRIEF DESCRIPTION OF THE DRAWINGS

The above and other advantages and features of this disclosure will become more apparent by describing in further detail embodiments thereof with reference to the accompanying drawings, in which:

FIG. 5A is a cross-sectional view illustrating an electronic device taken along line 5a-5a of FIG. 2A according to various embodiments of the disclosure.

FIG. 8B is an enlarged view illustrating an area 8b of FIG. 8A according to various embodiments of the disclosure.

FIG. 10 is a plan view of an electronic device illustrating a coupling structure between a gear support member and a sliding frame according to various embodiments of the disclosure.

FIGS. 13A and 13B are diagrams illustrating a drive module according to various embodiments of the disclosure.

FIG. 14A is a partial perspective view illustrating a bracket housing in which a drive module is disposed according to various embodiments of the disclosure.

DETAILED DESCRIPTION

Figure 1:
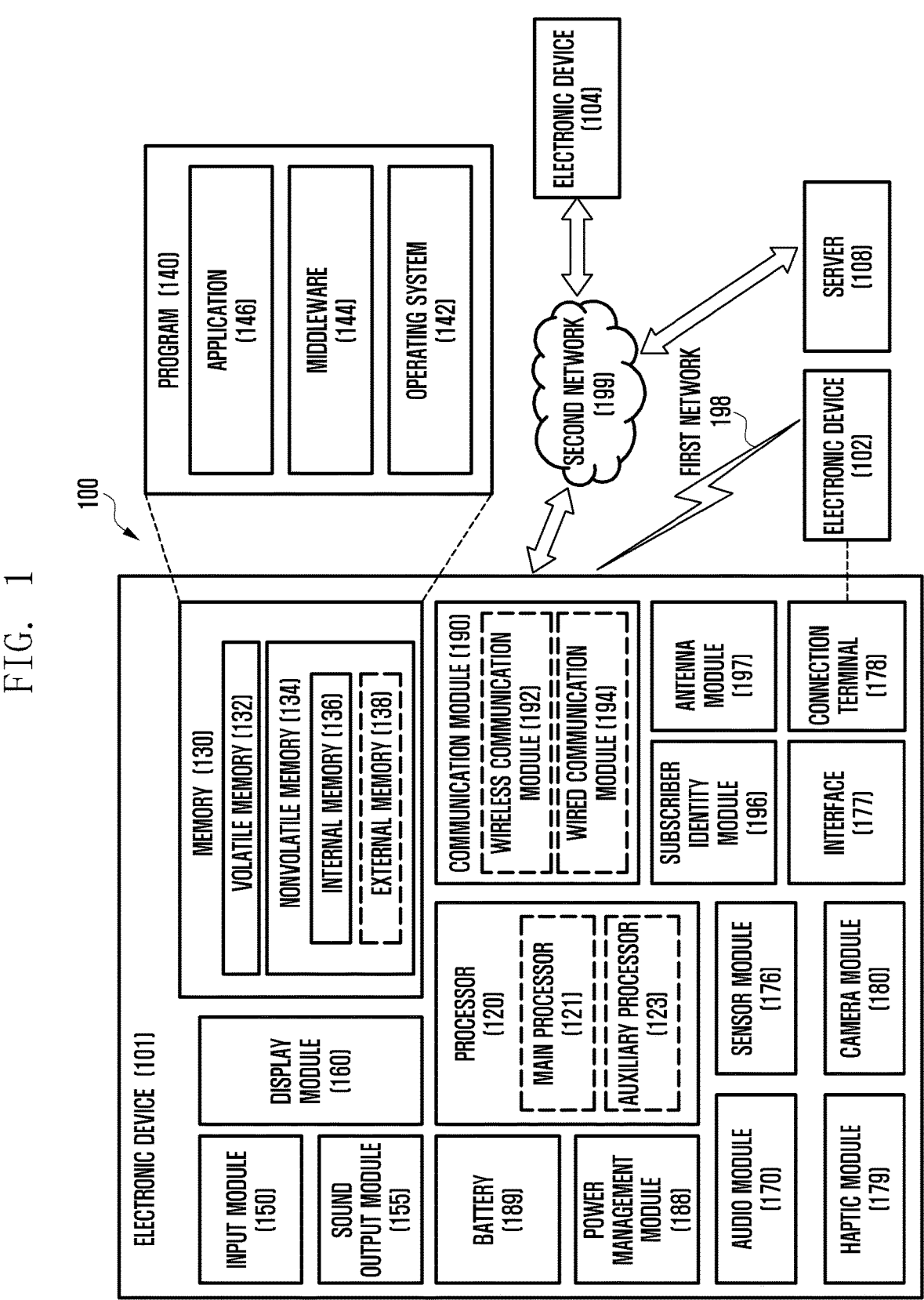
FIG. 1 is a block diagram illustrating an electronic device in a network environment according to various embodiments of the disclosure.

Hereinafter, embodiments of the disclosure will be described in detail with reference to the accompanying drawings. In the drawings, for example, the sizes and shapes of elements may be exaggerated for the convenience of description, and it may be expected that the illustrated shaped are changed when the elements are actually implemented. Therefore, embodiments of the disclosure is not limited by the particular shapes of areas shown in the specification.

Throughout the specification, the same or like reference signs designate the same or like elements.

As used in the specification, the term "and/or" includes any one or all possible combinations of one or more items enumerated together.

The embodiments of the disclosure are provided to completely explain the disclosure to those skilled in the art, the following embodiments may be modified in various other forms, and the scope of the disclosure is not limited to the following embodiments. Instead, the embodiments are provided to make the disclosure more complete and completely transfer the idea of the disclosure to those skilled in the art.

The terms used in the specification are used to describe embodiments, and are not intended to limit the scope of the disclosure. Although expressed in a singular form, the singular form may include a plural form unless definitely indicated in the context.

As used herein, the term "comprise" or "comprising" is intended to specify the existence of mentioned shapes, numbers, steps, operations, elements, components, and/or groups thereof, and does not preclude the possible existence or addition of other shapes, numbers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a block diagram illustrating an example electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting (or connection) terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and/or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
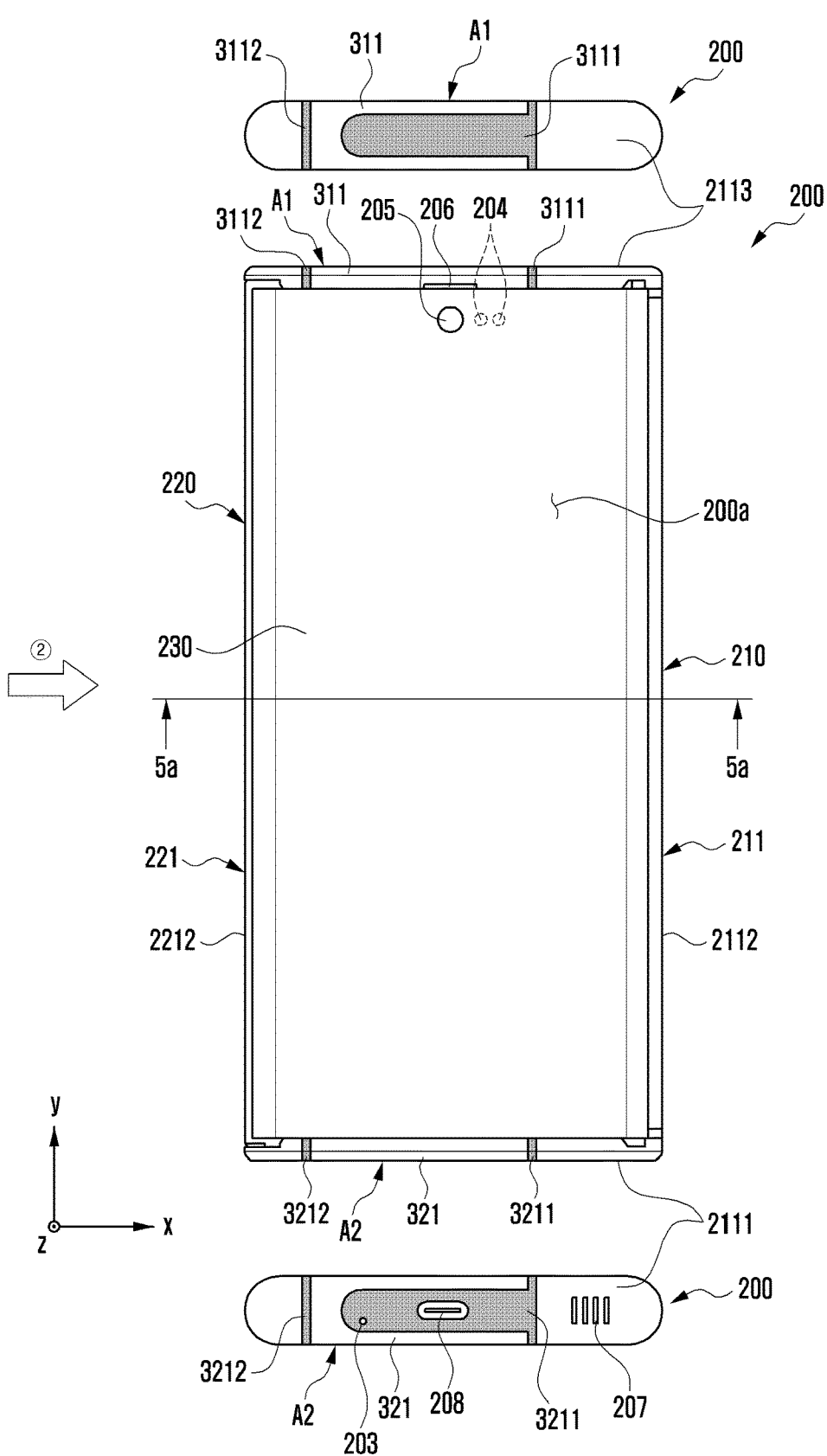
FIGS. 2A and 2B are diagrams respectively illustrating a front surface, a top end surface, a bottom end surface and a rear surface of an electronic device in a slide-in state according to various embodiments of the disclosure.
Figure 2B:
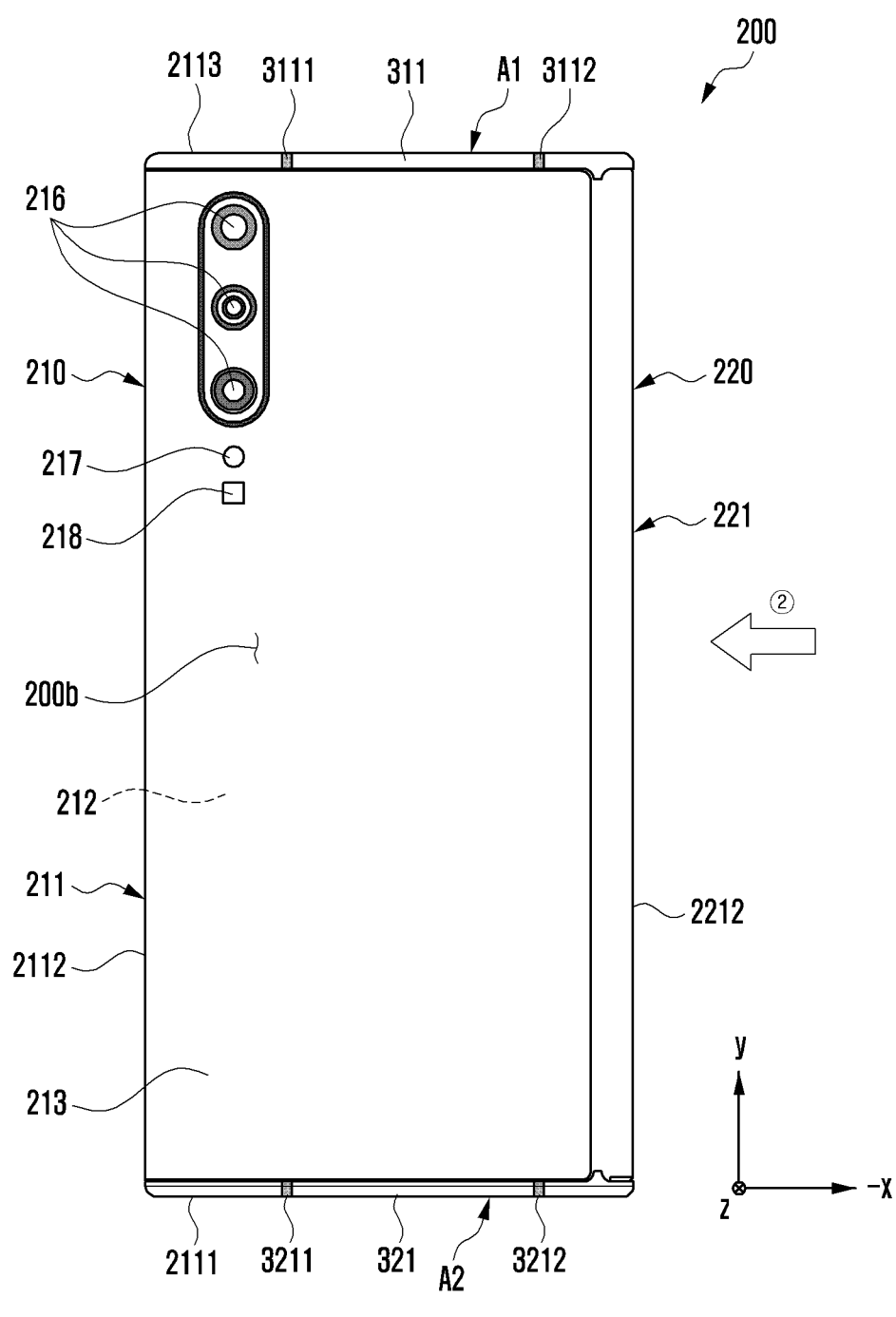
Figure 3A:
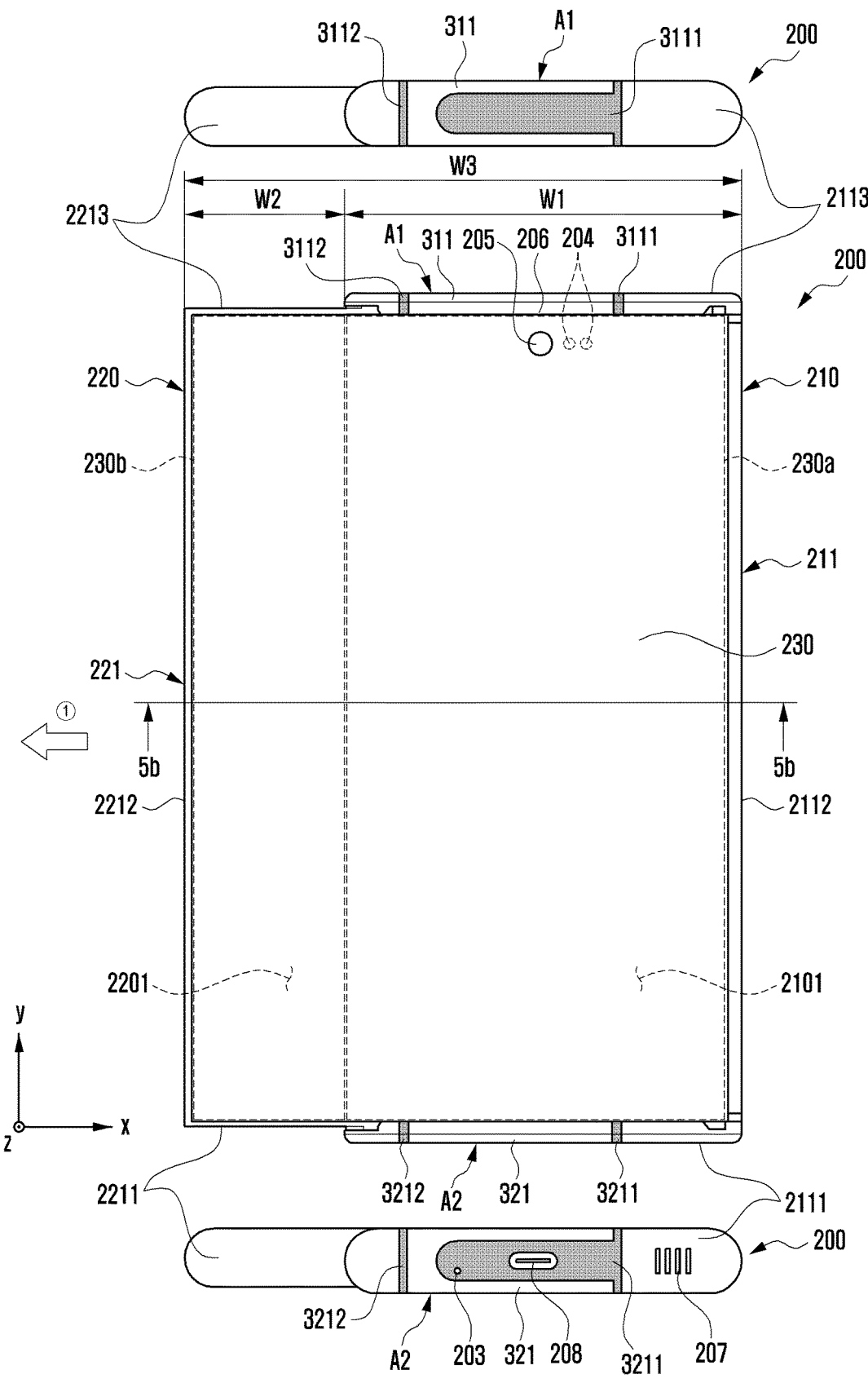
FIGS. 3A and 3B are diagrams respectively illustrating a front surface, a top end surface, a bottom end surface and a rear surface of an electronic device in a slide-out state according to various embodiments of the disclosure.
Figure 3B:
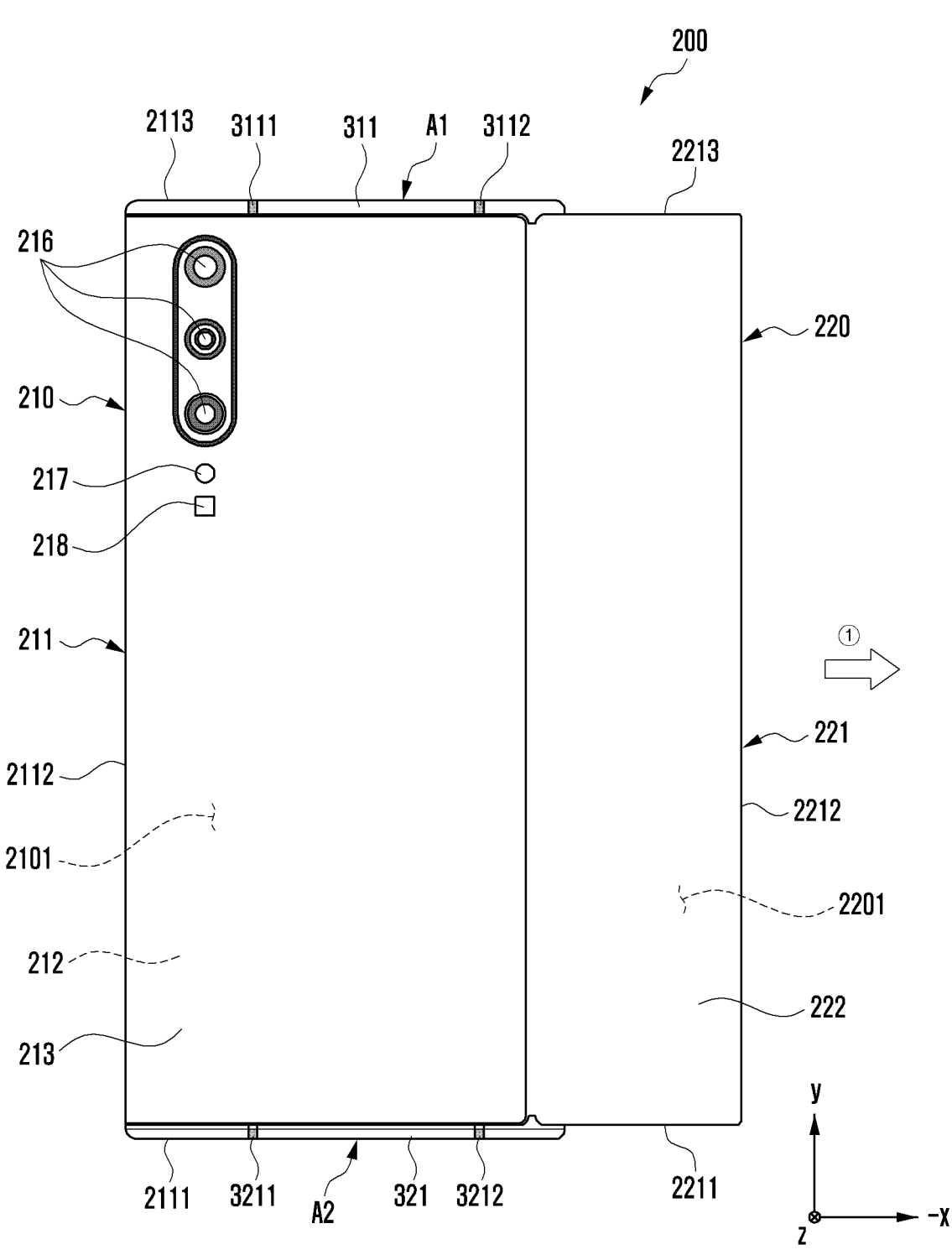

FIGS. 2A and 2B are diagrams respectively illustrating a front surface, a top end surface, a bottom end surface and a rear surface of an electronic device in a slide-in state according to various embodiments of the disclosure. FIGS. 3A and 3B are diagrams respectively illustrating a front surface, a top end surface, a bottom end surface and a rear surface of an electronic device in a slide-out state according to various embodiments of the disclosure.

An electronic device 200 of FIGS. 2A to 3B may be at least partially similar to the electronic device 101 of FIG. 1 or may further include other components of the electronic device 101.

With reference to FIGS. 2A to 3B, the electronic device 200 may include a first housing 210 (e.g., first housing structure or base housing), a second housing 220 (e.g., second housing structure or slide housing) movably coupled to the first housing 210 in a designated direction (e.g., X-axis direction or a sliding direction) and within a designated distance from the first housing 210, and a flexible display 230 (e.g., expandable display or stretchable display) disposed to be supported through at least a portion of the first housing 210 and the second housing 220. According to an embodiment, at least a portion of the second housing 220 may be received in or retracted into a first space 2101 (e.g., a first receiving space) of the first housing 210, thereby defining a slide-in state for which the electronic device 200 is closed and incudes the portion of the second housing 220 received in or retracted into the first receiving space.

According to an embodiment, the electronic device 200 may include a support member (e.g., bendable member or bendable support member) (e.g., a support member 240 of FIG. 4) (e.g., multi-joint hinge module or multi-bar assembly) at least partially forming the same plane as that of at least a portion of the first housing 210 in a slide-out state, and at least partially received in a second space 2201 (e.g., a second receiving space) of the second housing 220 in a slide-in state. According to an embodiment, at least a portion of the flexible display 230 may be received in the internal space 2201 of the second housing 220 while being supported by the support member (e.g., the support member 240 of FIG. 4) in a slide-in state to be disposed to be invisible from the outside (e.g., the outside of the electronic device 200). According to an embodiment, at least a portion of the flexible display 230 may be disposed to be visible from the outside while being supported by a support member (e.g., the support member 240 of FIG. 4) forming at least partially the same plane as that of the first housing 210 in the slide-out state.

According to various embodiments, the electronic device 200 may include a front surface 200a (e.g., first surface), a rear surface 200b (e.g., second surface) facing in a direction opposite to the front surface 200a, and a side surface (not illustrated) enclosing a space between the front surface 200a and the rear surface 200b together with the front surface 200a and the rear surface 200b. According to an embodiment, the electronic device 200 may include a first housing 210 including a first side member 211 and a second housing 220 including a second side member 221.

According to an embodiment, the first side member 211 may include a first side surface 2111 having a first length in a first direction (e.g., X-axis direction), a second side surface 2112 extended to have a second length in a direction (e.g., Y-axis direction) substantially perpendicular to the first side surface 2111 which is longer than the first length, and a third side surface 2113 extended substantially parallel to the first side surface 2111 from the second side surface 2112 and having the first length. According to an embodiment, the first side member 211 may be at least partially made of a conductive material (e.g., metal). According to an embodiment, at least a portion of the first side member 211 may include a first extension member 212 (e.g., first support member) extended to define at least a portion of the first space 2101 of the first housing 210.

According to various embodiments, the second side member 221 may include a fourth side surface 2211 at least partially corresponding to the first side surface 2111 and having a third length, a fifth side surface 2212 extended in a direction substantially parallel to the second side surface 2112 from the fourth side surface 2211 and having a fourth length longer than the third length, and a sixth side surface 2213 extended to correspond to the third side surface 2113 from the fifth side surface 2212 and having the third length. According to an embodiment, the second side member 221 may be at least partially made of a conductive material (e.g., metal). According to an embodiment, at least a portion of the second side member 221 may include a second extension member 222 (e.g., second support member) extended to at least a portion of the second space 2201 of the second housing 220.

According to an embodiment, the first side surface 2111 and the fourth side surface 2211 may be slidably coupled to each other, and the third side surface 2113 and the sixth side surface 2213 may be slidably coupled to each other. According to an embodiment, in the slide-in state, the fourth side surface 2211 may overlap the first side surface 2111 to be inside first side surface 2111 and disposed to be substantially invisible from the outside. According to an embodiment, in the slide-in state, the sixth side surface 2213 may overlap the third side surface 2113 to be disposed to be inside the third side surface 2113 substantially invisible from the outside. In some embodiments, at least a portion of the fourth side surface 2211 and the sixth side surface 2213 may be disposed to be at least partially visible from the outside in a slide-in state. According to an embodiment, in the slide-in state, the second extension member 222 may overlap the first extension member 212 to be disposed to be substantially invisible from the outside. In some embodiments, in a slide-in state, a portion of the second extension member 222 may overlap the first extension member 212 to be disposed to be invisible from the outside, and a remaining portion of the second extension member 222 may be disposed to be visible from the outside.

According to an embodiment, the electronic device may 200 include a rear cover 213 disposed in at least a portion of the first housing 210 at the rear surface 200b. According to an embodiment, the rear cover 213 may be disposed through at least a portion of the first extension member 212. In some embodiments, the rear cover 213 may be integrally formed with the first side member 211. According to an embodiment, the rear cover 213 may be made of a polymer, coated or colored glass, ceramic, a metal (e.g., aluminum, stainless steel (STS), or magnesium), or a combination of at least two of the above materials. In some embodiments, the rear cover 213 may be extended to at least a portion of the first side member 211. In some embodiments, at least a portion of the first extension member 212 may be replaced with an extended portion of the rear cover 213. In some embodiments, the electronic device 200 may include another rear cover (e.g., second rear cover) disposed in at least a portion of the second extension member 222 or replaced with at least a portion of the second extension member 222 in the second housing 220.

According to various embodiments, the electronic device 200 may include a flexible display 230 disposed to be supported by at least a portion of the first housing 210 and the second housing 220. According to an embodiment, the flexible display 230 may include a first portion 230a (e.g., planar portion) always visible from the outside and a second portion 230b (e.g., bendable portion or retractable portion) extended from the first portion 230a and at least partially received in the second space 2201 of the second housing 220 to be invisible from the outside in the slide-in state. A display area, such as a visible display area, may be formed by the first portion 230a together with a visible area of the second portion 230b. According to an embodiment, the first portion 230a may be disposed to be supported by the first housing 210, and the second portion 230b may be disposed to be at least partially supported by the support member (e.g., the support member 240 of FIG. 4). Referring to FIG. 2A, in the electronic device 200 which is closed (e.g., the slid-in state), the visible area of the second portion 230b of the flexible display 230 may be minimal. In the electronic device 200 which is partially opened, the visible area may be increased from the closed state of the electronic device 200. In the electronic device 200 which is maximally opened, the visible area of the second portion 230 may be maximum.

According to an embodiment, a visible area of the flexible display 230 may be enlarged from just the visible area of the first portion 230*a* while being supported by the support member (e.g., the support member 240 of FIG. 4) in a state in which the second housing 220 is slid-out in a designated direction (①direction along the sliding direction) relative to the first housing 210, to form an extended visible area in the substantially same plane as that of the first portion 230*a*, and to be visible from the outside. According to an embodiment, the second portion 230*b* of the flexible display 230 may be disposed to be received in the second space 2201 of the second housing 220 in a state in which the second housing 220 is slid-in in a designated direction (②direction along the sliding direction) and to be invisible from the outside. Accordingly, the electronic device 200 may induce a size of a display area of the flexible display 230 to be changeable by sliding of the second housing 220 along a designated direction as the sliding direction (e.g., X-axis direction), relative to the first housing 210. That is, the visible display area of the flexible display 230 may be variable by sliding of the second housing 220 into and out of the first housing 210, along the sliding direction.

According to various embodiments, the first housing 210 and the second housing 220 may be operated in a sliding manner relative to each other such that the entire width of the first housing 210 and the second housing 220 is variable with respect to each other. According to an embodiment, a total (closed) width of the electronic device 200 along the sliding direction may be configured to have a first width W1 from the second side surface 2112 to the fourth side surface 2212, in the slide-in state. According to an embodiment, in the slide-out state, as at least a portion of the support member (e.g., the support member 240 of FIG. 4) received in the second space 2201 of the second housing 220 may be moved to have a second width W2, the electronic device 200 may be configured to have a third width W3 as a total (opened) width which is greater than the first width W1. For example, the flexible display 230 may have a display area substantially corresponding to the first width W1 in the slide-in state or the closed state, and have an expanded display area substantially corresponding to the third width W3 in the slide-out state as the opened state. Here, the third width W3 may be a sum of the first width W1 and the second width W2.

According to various embodiments, the slide-in/slide-out operation of the electronic device 200 may be automatically performed. As being automatic, operation may be achieved by a mechanical driver within the electronic device 200 rather than a manual driving force exerted from an outside of the electronic device 200. For example, the electronic device 200 may receive an operation request for changing from a slide-in state to a slide-out state or changing from a slide-out state to a slide-in state. The operation request may operate a drive module as a driver (e.g., the drive module 400 of FIG. 4) disposed inside of the electronic device 200. According to an embodiment, the operation request as an input may be performed through a designated operation button disposed in the electronic device 200 and/or a touch manipulation of a corresponding object displayed on the flexible display 230. According to an embodiment, when the electronic device 200 detects an event or request for changing to a respective state among the slide-in/slide-out state thereof through the processor (e.g., the processor 120 of FIG. 1), the electronic device 200 may be configured to control an operation of the second housing 220 through the drive module. According to an embodiment, the processor (e.g., the processor 120 of FIG. 1) of the electronic device 200 may display an object in various manners to correspond to a changed display area of the flexible display 230 according to a slide-in state, a slide-out state, or an intermediate state (e.g., free stop state), and control a display screen of the flexible display 230 so as to execute an application program. In an embodiment, the slide-in state may be the electronic device 200 in which the second housing 220 is completely retracted into the first housing 210 to have a minimal (or no) exposed area. The slide-out state may be electronic device 200 in which the second housing 220 is completely extended out of the first housing 210 to have a maximum exposed area. The intermediate state (e.g., free stop state) may be the electronic device 200 in which the second housing 220 is between completely retracted and completely extended to be partially retracted (or partially extended) relative to the first housing 210.

According to various embodiments, the electronic device 200 may include at least one of an input device (e.g., the microphone 203), a sound output device (e.g., the call receiver 206 or the speaker 207), sensor modules 204 and 217, a camera module (the first camera module 205 or the second camera module 216), a connector port 208, a key input device (not illustrated), or an indicator (not illustrated) disposed in the first space 2101 (e.g., first inner space) of the first housing 210. In another embodiment, the electronic device 200 may be constituted so that at least one of the above-described components may be omitted or other components may be additionally included. In another embodiment, at least one of the above-described components may be disposed in the second space 2201 (e.g., second inner spaced) of the second housing 220. One or more of the above input devices, output devices, modules, etc. may be defined as a functional component of the electronic device 200 by which a function of the electronic device 200 is provided.

According to various embodiments, the input device may include a microphone 203. In some embodiments, the input device (e.g., the microphone 203) may include a plurality of microphones disposed to detect a direction of a sound. The sound output device may include, for example, a call receiver 206 and a speaker 207. According to an embodiment, in the slide-out state, the speaker 207 may face the outside through at least one speaker hole formed in the first housing 210. According to an embodiment, in the slide-out state, a connector port 208 may face the outside through a connector port hole formed in the first housing 210. In some embodiments, the call receiver 206 may include a speaker (e.g., piezo speaker) operating while a separate speaker hole is excluded.

According to various embodiments, sensor modules 204 and 217 may generate an electrical signal or a data value corresponding to an internal operation state of the electronic device 200 or an external environmental state. The sensor modules 204 and 217 may include, for example, a first sensor module 204 (e.g., proximity sensor or illuminance sensor) disposed at the front surface 200*a* of the electronic device 200 and/or a second sensor module 217 (e.g., heart rate monitoring (HRM) sensor) disposed at the rear surface 200*b* thereof. According to an embodiment, the first sensor module 204 may be disposed under the flexible display 230 at the front surface 200*a* of the electronic device 200. According to an embodiment, the first sensor module 204 and/or the second sensor module 217 may include at least one of a proximity sensor, an illuminance sensor, a time of flight (TOF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various embodiments, the camera module may include a first camera module 205 disposed at the front surface 200a of the electronic device 200 and a second camera module 216 disposed at the rear surface 200b thereof. According to an embodiment, the electronic device 200 may include a flash 218 located near the second camera module 216. According to an embodiment, the camera modules 205 and 216 may include one or a plurality of lenses, an image sensor, and/or an image signal processor. According to an embodiment, the first camera module 205 may be disposed under the flexible display 230, and be configured to photograph a subject through a part of an active area (e.g., a display area) of the flexible display 230. According to an embodiment, the flash 218 may include, for example, a light emitting diode or a xenon lamp.

According to various embodiments, the first camera module 205 among the camera modules and some sensor module 204 of the sensor modules 204 and 217 may be disposed to detect an external environment through the flexible display 230. For example, in the first space 2201 of the first housing 210, the first camera module 205 or the some sensor module 204 may be disposed to be in contact or communication with an external environment, such as through a transmission area or a perforated opening formed in the flexible display 230. Through the transmission area and/or the opening, various inputs like light, audio sounds, pressure, etc. may be transmitted to one or more functional component. According to an embodiment, an area (e.g., planar area) facing the first camera module 205 of the flexible display 230 may be formed as a transmission area (e.g., a light transmission area) having a designated transmittance (e.g., a light transmittance) as a part of an overall area for displaying contents (e.g., an overall display area). According to an embodiment, the transmission area may be formed to have a light transmittance in a range of about 5% to about 20%. Such a light transmission area may include a planar area overlapping an effective area (e.g., view angle area) of the first camera module 205, through which light for generating an image by being imaged by an image sensor passes. For example, the transmission area of the flexible display 230 may include an area having a lower pixel density and/or a lower wiring density than that of the periphery. For example, the transmission area may replace the above-described opening. For example, some camera module 205 may include an under display camera (UDC). In some embodiments, the some sensor module 204 may not be visually exposed to outside the housing through the flexible display 230 in the internal space of the electronic device 200, but may be disposed to perform a function thereof.

According to various embodiments, the electronic device 200 may include at least one antenna A1 and A2 electrically connected to a wireless communication circuit (e.g., the wireless communication module 192 of FIG. 1) disposed in the first space 2101 of the first housing 210. According to an embodiment, the at least one antenna A1 and A2 may include a first antenna A1 disposed in an upper area of the electronic device 200 and a second antenna A2 disposed in a lower area of the electronic device 200. In some embodiments, the electronic device may further include at least one additional antenna disposed at the second side surface of the first housing and/or the fifth side surface of the second housing.

According to an embodiment, the first antenna A1 may include a first conductive portion 311 segmented through at least one non-conductive portion 3111 and 3112 at the third side surface 2113 of the first side member 211. According to an embodiment, the first conductive portion 311 may be disposed to be segmented through the first non-conductive portion 3111 and the second non-conductive portion 3112 spaced apart from each other at designated intervals, and be electrically connected to a wireless communication circuit (e.g., the wireless communication module 192 of FIG. 1). According to an embodiment, the second antenna A2 may include a second conductive portion 321 segmented through at least one non-conductive portion 3211 and 3212 at the first side surface 2111 of the first side member 211. According to an embodiment, the second conductive portion 321 may be disposed to be segmented through a third non-conductive portion 3211 and a fourth non-conductive portion 3212 spaced apart from each other at designated intervals, and be electrically connected to a wireless communication circuit (e.g., the wireless communication module 192 of FIG. 1).

According to an embodiment, the wireless communication circuit (e.g., the wireless communication module 192 of FIG. 1) may be configured to transmit and/or receive a wireless signal in a designated frequency band (e.g., about 800 megahertz (MHz) to about 6000 MHz) through the first conductive portion 311 and/or the second conductive portion 312. In some embodiments, the electronic device may further include at least one antenna module (e.g., 5G antenna module or antenna structure) disposed in the internal space and disposed to transmit and receive a wireless signal in a frequency band in a range of about 3 gigahertz (GHz) to about 100 GHz through another wireless communication circuit (e.g., the wireless communication module 192 of FIG. 1).

The electronic device 200 according to example embodiments of the disclosure may include a drive module (e.g., the drive module 400 of FIG. 4) disposed in an internal space for a slide-in/slide-out operation. According to an embodiment, the drive module (e.g., the drive module 400 of FIG. 4) may be disposed in consideration of a relationship with a peripheral electronic component in an internal space of the electronic device 200, thereby helping decrease in thickness of the electronic device 200. Further, a gear support (e.g., a gear support member 420 of FIG. 6A) and a motor (e.g., a drive motor 410 of FIG. 6A) of the drive module (e.g., the drive module 400 of FIG. 4) are provided in units of modules and include a friction reduction structure for reducing a frictional force, thereby helping to improve sliding operational reliability of the electronic device 200.

Figure 4:
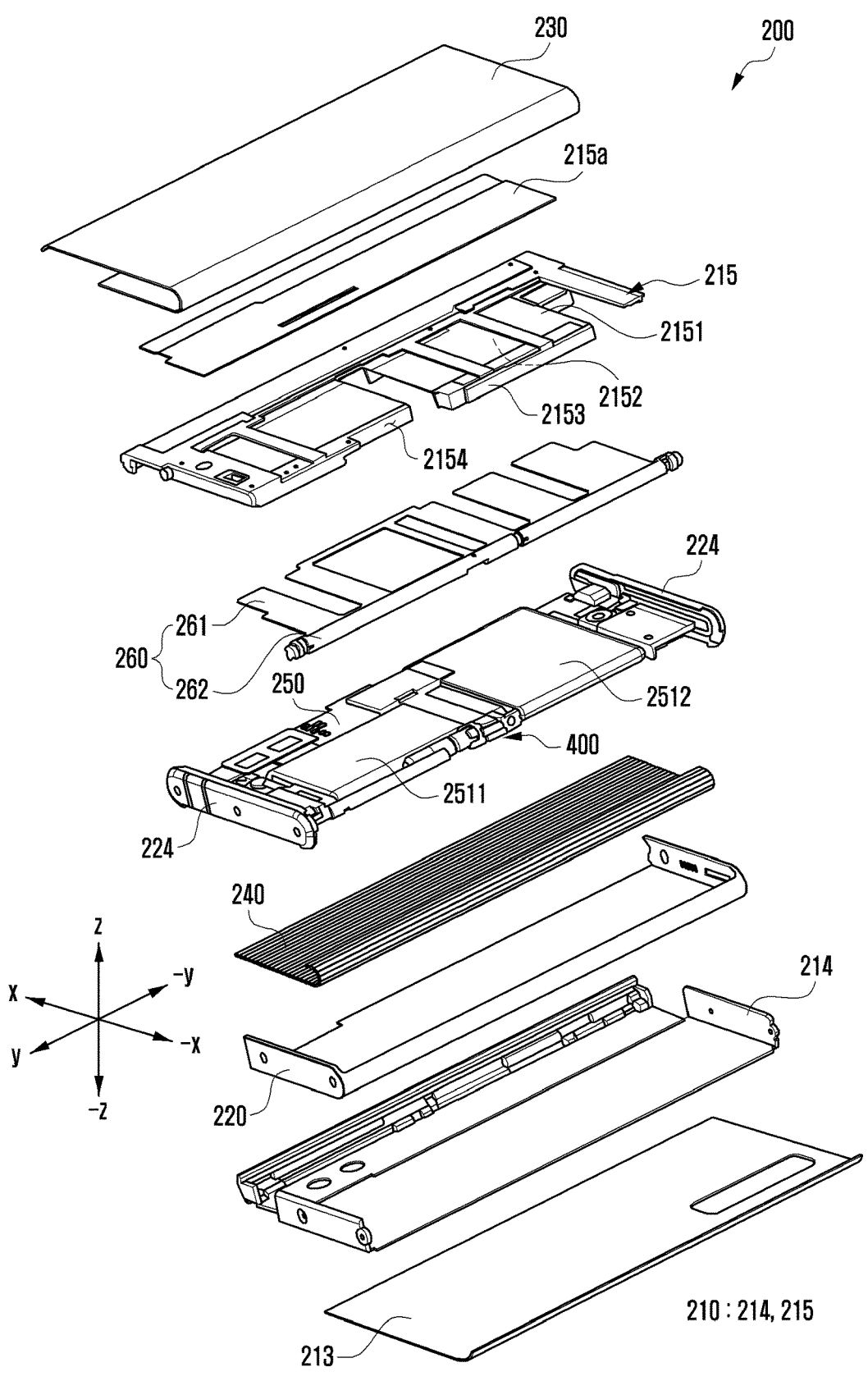
FIG. 4 is an exploded perspective view illustrating an electronic device according to various embodiments of the disclosure.
Figure 5A:
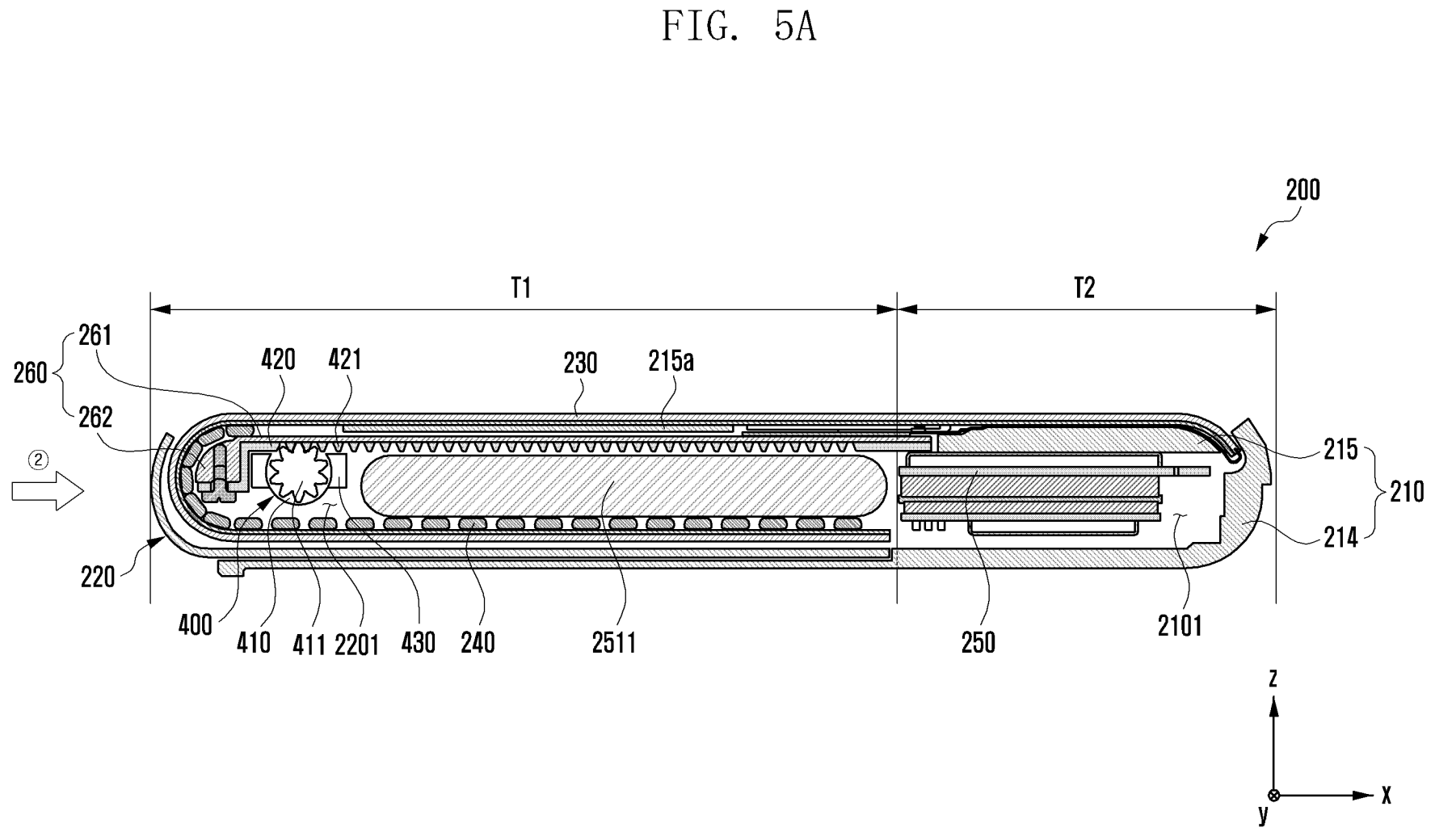
Figure 5B:
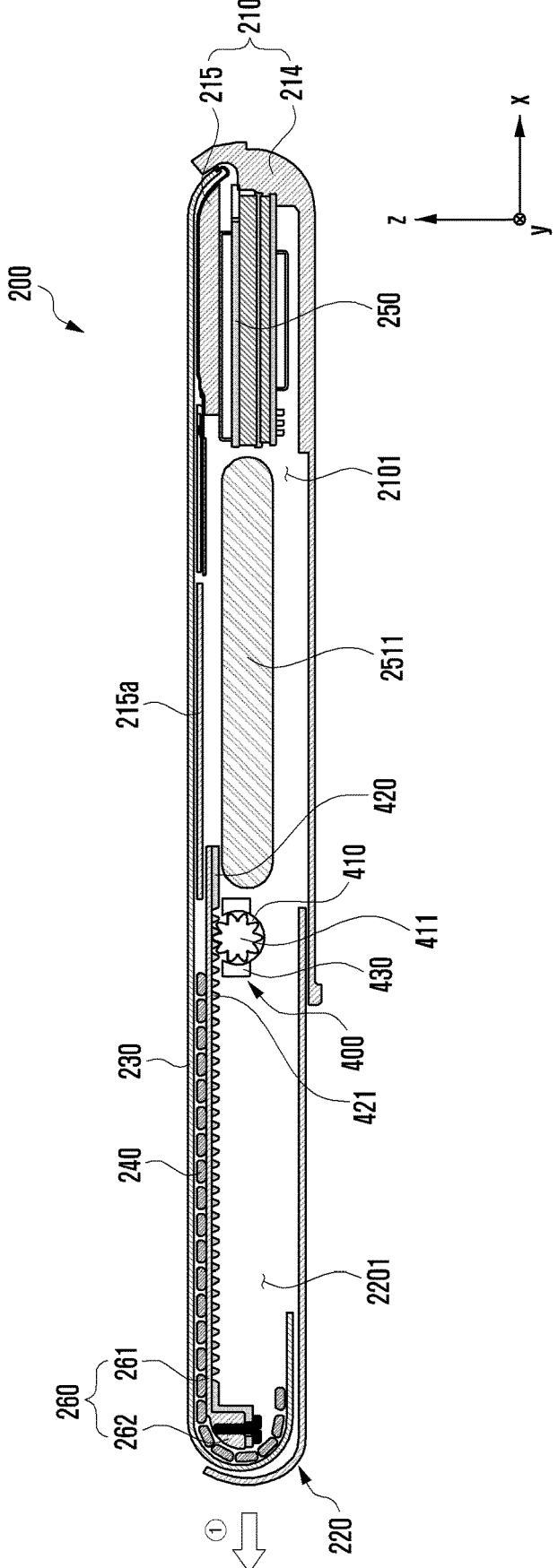
FIG. 5B is a cross-sectional view illustrating an electronic device taken along line 5b-5b of FIG. 3A according to various embodiments of the disclosure.

FIG. 4 is an exploded perspective view illustrating an electronic device 200 according to various embodiments of the disclosure. FIG. 5A is a cross-sectional view illustrating an electronic device taken along line 5a-5a of FIG. 2A according to various embodiments of the disclosure. FIG. 5B is a cross-sectional view illustrating an electronic device taken along line 5b-5b of FIG. 3A according to various embodiments of the disclosure.

With reference to FIGS. 4 to 5B, the electronic device 200 may include a first housing 210 including (or defining) a first space 2101, a second housing 220 slidably coupled to the first housing 210 and including (or defining) a second space 2201, a support member 240 (e.g., multi-bar assembly) rotatably disposed at least partially in the second space 2201, and a flexible display 230 disposed to receive the support of at least a portion of the support member 240 and the first housing 210. According to an embodiment, the first space 2101 of the first housing 210 may be provided through coupling of a cover housing 214 and a bracket housing 215 to each other. The first housing 210 may be open along the X-axis direction In some embodiments, at least a portion of the cover housing 214 may include a first extension member (e.g., the first extension member 212 of FIG. 3D) or may be replaced with the first extension member 212. According to an embodiment, the bracket housing 215 may include a first surface 2151 facing in a first direction (e.g., Z-axis direction), a second surface 2152 facing in a second direction (e.g., −Z-axis direction) opposite to the first surface 2151, and a side surface 2153 between the first surface 2151 and the second surface 2152. According to an embodiment, the electronic device 200 may include an auxiliary cover 215a disposed facing at least a portion of the first surface 2151 of the bracket housing 215 and under the flexible display 230 to provide a flat surface of flat profile of the flexible display 230, especially when the electronic device 200 is opened.

According to various embodiments, the electronic device 200 may include a substrate 250 disposed in the first space 2201 between the cover housing 214 and the second surface 2152 of the bracket housing 215, and at least one battery 2511 and 2512 disposed near the substrate 250. According to an embodiment, the at least one battery 2511 and 2512 may include a first battery 2511 and a second battery 2512 spaced apart from each other at designated intervals in the first space 2101. However, the disclosure is not limited thereto, and the number of at least one battery may not be limited. According to an embodiment, the electronic device 200 may include a camera module (e.g., the camera module 216 of FIG. 3A) or a sensor module (e.g., the sensor module 217 of FIG. 3A) disposed in the first space 2101.

According to an embodiment, the support member 240 may be disposed such that one end thereof is fixed to the first housing 210 and the other end thereof is at least partially movably received in the second space 2201 of the second housing 220. For example, the support member 240 may be at least partially received in the second space 2201 in the slide-in state (FIG. 5A), and be at least partially slid-out from the second space 2201 so as to be disposed in substantially the same plane as that of the first housing 210 (e.g., the bracket housing 215) in the slide-out state (FIG. 5B). As being in a same plane, elements may be coplanar with each other. Accordingly, the flexible display 230 supported by at least a portion of the support member 240 and the first housing 210 may have a variable display area visible from the outside according to a sliding operation. Referring to FIGS. 5A and 5B, the display area may be defined between opposing ends of the electronic device 200 along the X-axis direction. The display area may have a same dimension along an entirety of the Y-axis direction of the electronic device 200, without being limited thereto. In an embodiment, the display area in FIGS. 5A and 5B may be disposed between an upper end of the cover housing 214 and an upper end of the second housing 220 which oppose each other along the sliding direction.

According to an embodiment, the electronic device 200 may include at least one guide rail 224 disposed between the first housing 210 and the second housing 220 for inducing or guiding a sliding operation of the second housing 220. In some embodiments, the electronic device 200 may further include a side cover (not illustrated) disposed to cover both outer side surfaces (e.g., the first side surface 2111 and the third side surface 2113 of FIG. 2A) of the first housing 210.

According to various embodiments, the electronic device 200 may include a sliding frame 260 disposed to be at least partially movable in a direction (① direction) of the second space (e.g., the second space 2201 of FIG. 5B) in a direction away from the first housing 210, and coupled to the second housing 220. According to an embodiment, the sliding frame 260 may include a plate 261 slidably coupled to the first housing 210 (e.g., the bracket housing 215) and a sliding bar 262 which is extended from the plate 261 and for pressing a rear surface of the support member 240. In some embodiments, the plate 261 and the sliding bar 262 may be separately provided and be structurally coupled. According to an embodiment, the sliding frame 260 may be included as a part of the second housing 220. For example, the sliding frame 260 may be integrally formed with the second housing 220 to form a part thereof. According to an embodiment, when a structure of the sliding frame 260 is included in the second housing 220, the sliding frame 260 as a separate member may be omitted.

According to various embodiments, the electronic device 200 may include a drive module 400 as a driver disposed in an internal space (e.g., the first space 2101 together with the second space 2201) and for providing a driving force for moving the second housing 220 relative to the first housing 210 along the sliding direction, that is, in a slide-out direction (① direction) and/or a slide-in direction (② direction). According to an embodiment, the drive module 400 may include a drive motor 410 including a first gear 411 (e.g., pinion gear) disposed in a first housing 210 (e.g., the bracket housing 215), and a gear support including a second gear 421 (e.g., rack gear) gear-coupled to the first gear 411 to be engaged therewith and disposed in the sliding frame 260 (e.g., the plate 261). According to an embodiment, the second gear 421 may be integrally formed with the gear support member 420 (e.g., the gear support). In some embodiments, the second gear 421 may be provided separately from the gear support member 420 and be fixed to gear support member 420.

According to an embodiment, the drive motor 410 may be fixed to a receiving part 2154 or receiving recess formed at the side surface 2153 of the bracket housing 215, through a motor bracket 430, and be operatively coupled to the gear support member 420 fixed to the sliding frame 260. According to an embodiment, in a slide-in state, the electronic device 200 may include a first section T1 in which a portion of the flexible display 230 which is visible from the outside of the flexible display 230 and a portion of the flexible display 230 which is slid-in at the internal space 2201 of the second housing 220 and unvisible from the outside are overlapped with each other along a thickness direction (e.g., the Z-axis direction), and a second section T2 in which a portion of the flexible display 230 which is visible from the outside of the flexible display 230 and a portion of the flexible display 230 which is slid-in at the internal space 2201 of the second housing 220 and unvisible from the outside are not overlapped with each other along the thickness direction. According to an embodiment, the drive motor 410 of the drive module 400 which is in a fixed position within the first housing 210, may be disposed in at least a portion of the first section T1 within the electronic device 200 which is closed. In an embodiment, the drive motor 410 may be disposed at the side surface 2153 of the bracket housing 215 corresponding to the sliding bar 262 of the sliding frame 260 in the first section T1. That is, the drive motor 410 may be disposed coplanar with the sliding bar 262 of the sliding frame 260.

According to various embodiments, the drive motor 410 may be fixed in position within the first housing 210, at the side surface 2153 of the bracket housing 215 through the motor bracket 430, to be coplanar with the sliding frame 260, thereby inducing relative thickness reduction of the electronic device 200 compared to the drive motor 410 being disposed at the first surface 2151 or the second surface 2152 to help decrease in thickness of the electronic device 200. According to an embodiment, the motor bracket 430 may fix the drive motor 410 through a series fixing structure at the side surface 2153 of the bracket housing 215. According to an embodiment, the drive module 400 may be modularized such that the gear support member 420 may be guided through the motor bracket 430, thereby providing convenience of assembly. According to an embodiment, the drive module 400 may include a friction reduction structure provided to reduce frictional resistance during a sliding operation between the motor bracket 430 and the gear support member 420, thereby helping to reduce a loss of motor efficiency.

Figure 6A:
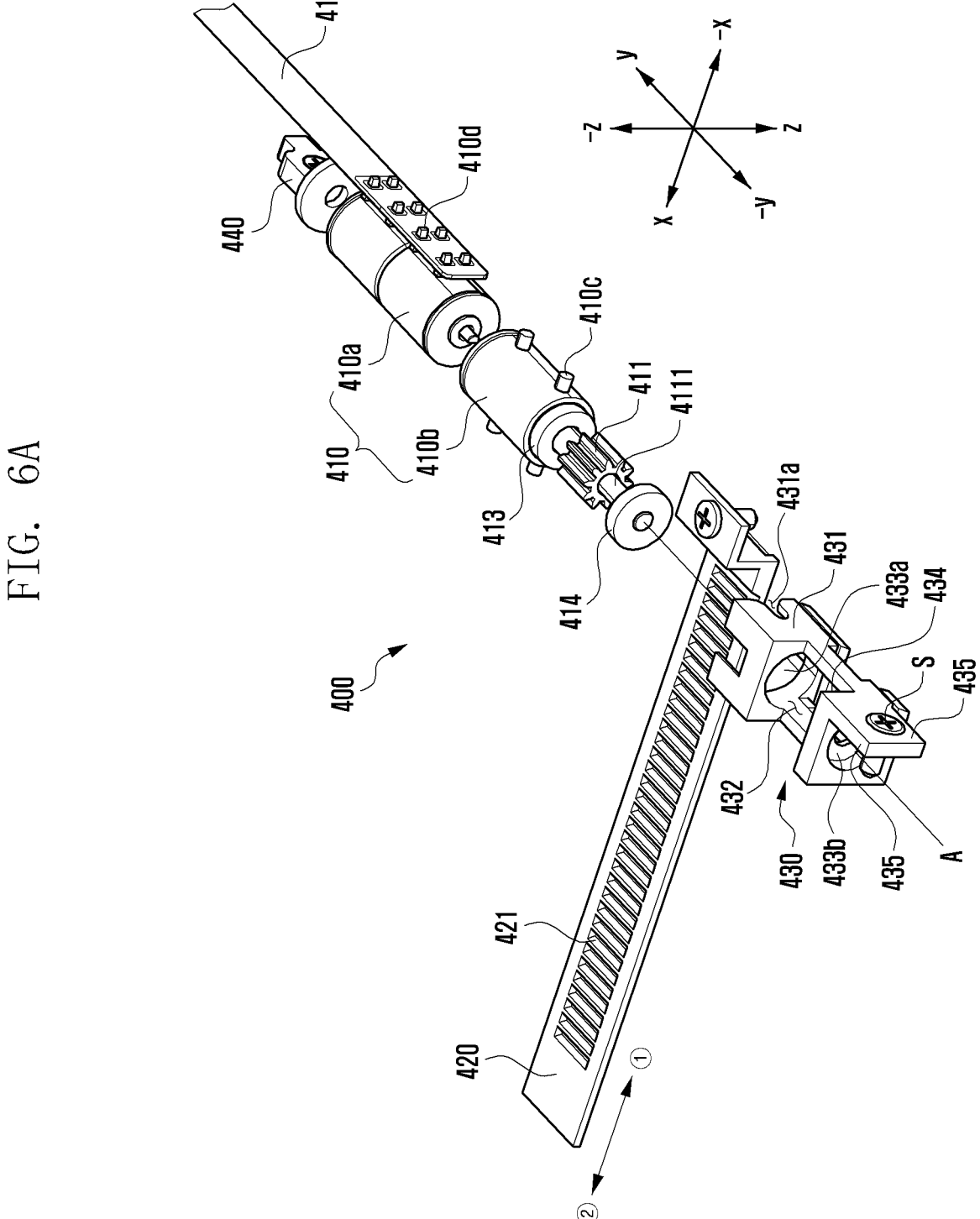
FIG. 6A is an exploded perspective view illustrating a drive module according to various embodiments of the disclosure.
Figure 6B:
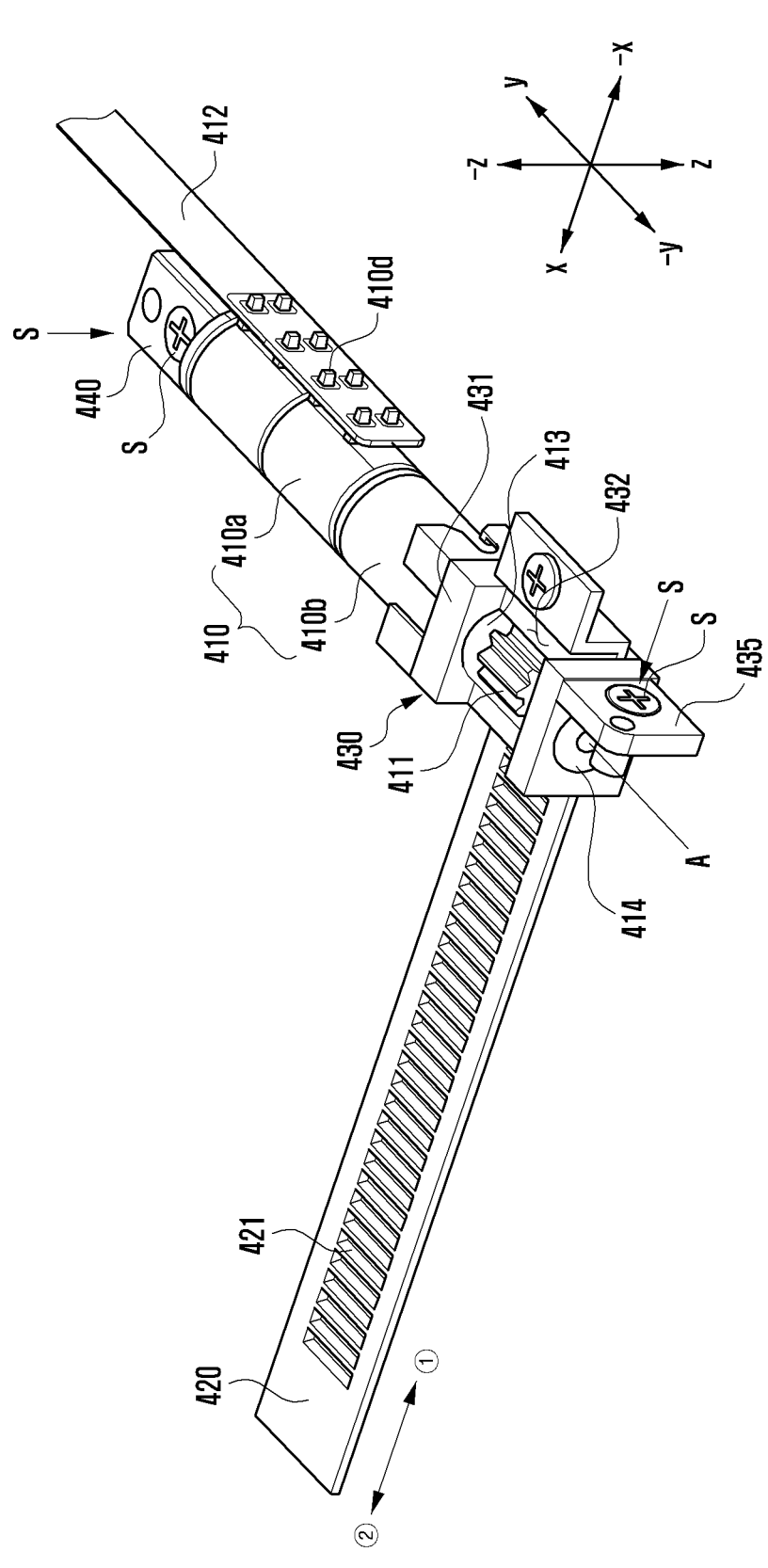
FIG. 6B is a coupling perspective view illustrating a drive module according to various embodiments of the disclosure.
Figure 6C:
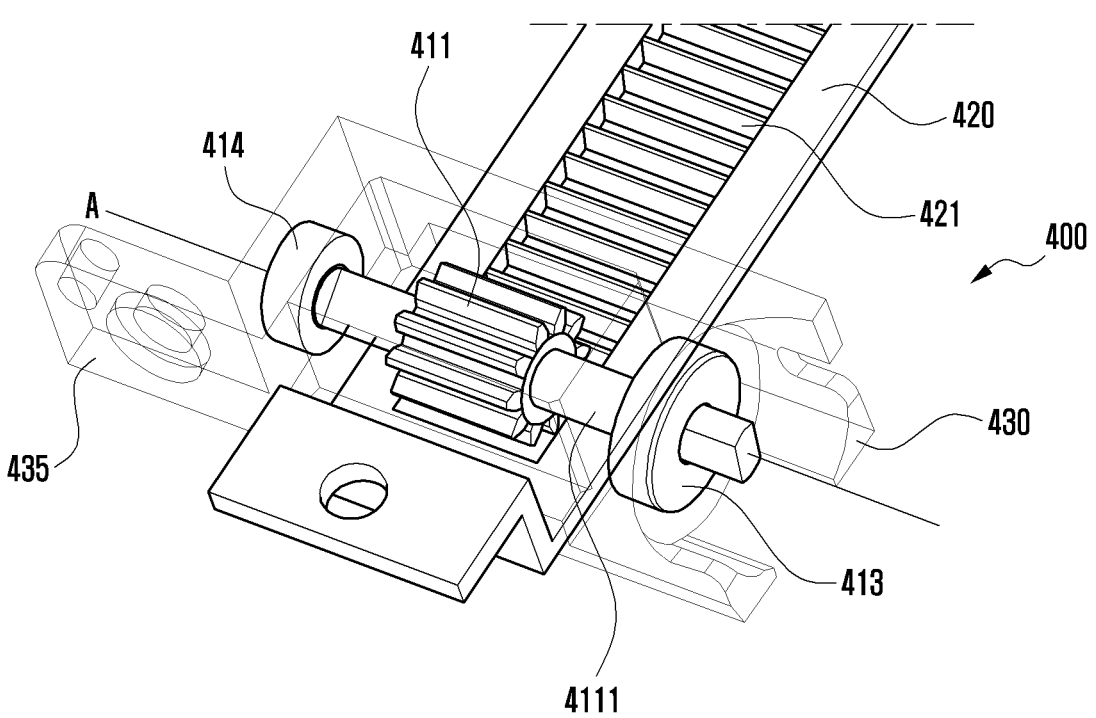
FIG. 6C is a schematic view illustrating a disposition structure between a bearing member and a motor bracket according to various embodiments of the disclosure.

FIG. 6A is an exploded perspective view illustrating a drive module 400 according to various embodiments of the disclosure. FIG. 6B is a perspective view illustrating a drive module 400 which is assembled according to various embodiments of the disclosure. FIG. 6C is an enlarged schematic view illustrating a disposition structure between a bearing member and a motor bracket according to various embodiments of the disclosure.

With reference to FIGS. 6A to 6C, the drive module 400 may include a drive motor 410 including a first gear 411 and a gear support member 420 including a rack gear 421 which is gear-coupled to the first gear 411. According to an embodiment, the drive motor 410 may include, for example, a motor unit 410a and a deceleration unit 410b (e.g., deceleration module). The deceleration unit 410b is coupled to the motor unit 410a and decelerates the number of revolutions of the motor unit 410a and includes a plurality of gear assemblies for increasing a rotational force. According to an embodiment, the first gear 411 may be, for example, a pinion gear and be fixed to a shaft 4111 rotatably installed based on a designated rotation axis A from the drive motor 410. According to an embodiment, the drive motor 410 may be electrically connected to a substrate (e.g., the substrate 250 of FIG. 4) of the electronic device (e.g., the electronic device 200 of FIG. 4) through a motor FPCB 412 (e.g., a motor circuit board). For example, the drive motor 410 may include at least one conductive terminal 410d (e.g., feeding and/or signal transmitting terminal) at an outer circumferential surface thereof, and the motor FPCB 412 may be electrically connected to the drive motor 410 through a bonding process such as soldering, bonding, taping or conductive welding with at least one conductive terminal 410d.

According to an embodiment, the gear support member 420 may be formed in a plate type, and include a second gear 421 formed (or provided) to be engaged with and gear-coupled to the first gear 411 at a surface corresponding to the first gear 411. According to an embodiment, when operation of the drive motor 410 rotates the first gear 411 along a rotation axis A, the gear support member 420 engaged with the first gear 411 may be moved along the sliding direction, that is, in the slide-out direction (① direction) or the slide-in direction (② direction), through a gearing operation through coupling of the second gear 421 to the first gear 411. Accordingly, the second housing (e.g., the second housing 220 of FIG. 4) and the sliding frame (e.g., the sliding frame 260 of FIG. 4) to which the gear support member 420 is fixed may be moved in a designated direction. Referring to FIGS. 5A and 5B, for example, the second housing 220, the sliding frame 260 and the gear support member 420 may be moveable together with each other, by rotation of the first gear 411.

According to various embodiments, the drive motor 410 may be at least partially fixed, through the motor bracket 430. According to an embodiment, the drive motor 410 may be fixed by being inserted into at least a portion of the motor bracket 430. In this case, the drive motor 410 may include an alignment protrusion 410c to be inserted into at least one alignment groove 431a formed in the motor bracket 430. Therefore, when the drive motor 410 is connected to the motor bracket 430 through welding, bonding, screw fastening, or structural coupling, a position of the drive motor 410 may be prevented from being twisted or deformed until the drive motor 410 is fixed to the bracket housing 430 through coupling between the alignment groove 431a and the alignment protrusion 410c.

According to various embodiments, the motor bracket 430 may include a body 431, and a fixing part 435 which is extended from the body 431 and for fixing the motor bracket 430 to the bracket housing (e.g., the bracket housing 215 of FIG. 4) through the fastening member S (e.g., screw). That is, the motor bracket 430 may be fixed to the housing of the electronic device 200 at the bracket housing 215 thereof, at the fixing part 435 of the motor bracket 430. According to an embodiment, the motor bracket 430 may include a space 432 formed in the body 431 and for receiving the first gear 411 after the shaft 4111 is at least partially penetrated body 431. According to an embodiment, the motor bracket 430 may include a first through hole 433a and a second through hole 433b formed at the left and right sides, respectively along an axial direction (direction of the rotation axis A) based on the space 432 of the body 431. The through holes are open to both the space 432 and outside of the motor bracket 430. According to an embodiment, the motor bracket 430 may include an opening 434 formed in a designated direction (e.g., Z-axis direction) in order to induce a gear coupling with the second gear 421 by exposing at least a portion of the first gear 411 in the space 432. Here, the opening 434 may be in communication with the space 432. Accordingly, when the drive motor 410 is assembled in the motor bracket 430, the first gear 411 may be received in and rotatable within the space 432 of the motor bracket 430. In this case, at least a portion of the first gear 411 may be exposed to the outside of the motor bracket 430 and/or be protruded from the motor bracket 430 through the opening 434 and be gear-coupled to operate with the second gear 421.

According to an embodiment, the drive module 400 may further include at least one bearing member 413 and 414 interposed between the shaft 4111 and the motor bracket 430 and for reducing frictional resistance. According to an embodiment, the at least one bearing member 413 and 414 may include a first bearing member 413 (e.g., a first bearing) interposed between the first through hole 433a and the shaft 4111, and a second bearing member 414 (e.g., a second bearing) interposed between the second through hole 433b and the shaft 4111. According to an embodiment, the drive module 400 may further include a dummy bracket 440 for supporting the motor unit 410a in a direction (Y-axis direction) opposite to a shaft disposition direction (e.g., −Y-axis direction) of the drive motor 410. According to an embodiment, the dummy bracket 440 may also be fixed to a side surface (e.g., the side surface 2153 of the first housing 210 of FIG. 4) of the bracket housing (e.g., the bracket housing

215 of FIG. 4) through the fastening member S (e.g., screw). According to an embodiment, the drive motor 410 may enable a fastening direction (e.g., X-axis direction) at the fixing part 435 of the motor bracket 430 fastened through the fastening members S and a fastening direction (e.g., Z-axis direction) at the dummy bracket 440 to be different from each other (e.g., perpendicular to each other), thereby reducing shaking (e.g., vibration) and receiving improved safety during operation.

Figure 6D:
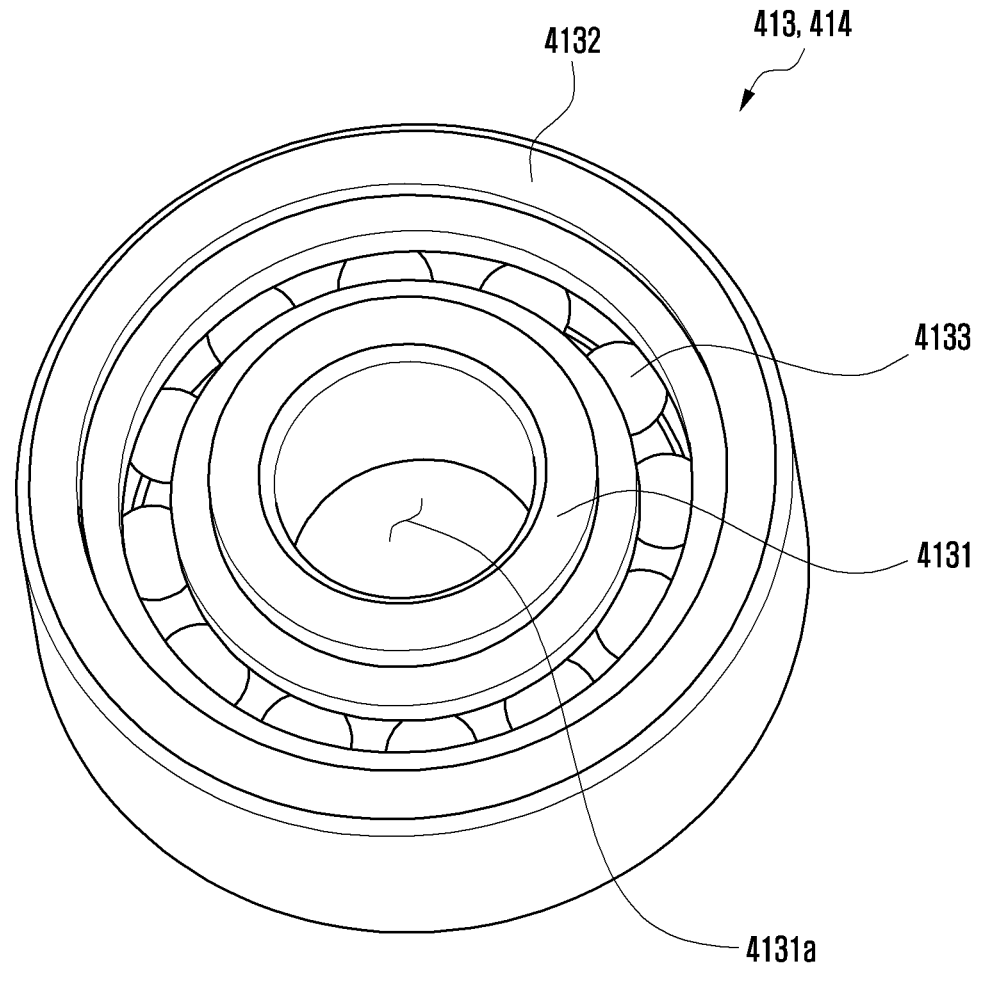
FIG. 6D is a perspective view illustrating a bearing member according to various embodiments of the disclosure.

FIG. 6D is a perspective view illustrating a bearing according to various embodiments of the disclosure.

With reference to FIG. 6D, each of the bearings 413 and 414 may include a first ring member 4131 (e.g., inner ring) including a hollow portion 4131*a*, a second ring member 4132 (e.g., outer ring) disposed to enclose the first ring member 4131, and a plurality of rolling members such as ball members 4133 disposed in a space between the first ring member 4131 and the second ring member 4132. According to an embodiment, the shaft 4111 may be self-rotatably coupled to the motor bracket 430 through the bearing members 413 and 414. According to an embodiment, the first ring member 4131 may be fixed to the shaft 4111 penetrating the hollow portion 4131*a*, and the second ring member 4132 may be fixed to the motor bracket 430. Accordingly, the bearing members 413 and 414 may induce a rolling motion with the ring members through the ball members 4133 disposed in a contact manner between the first ring member 4131 and the second ring member 4132, thereby helping to reduce frictional resistance due to a rotation of the drive motor 410.

Figure 6E:
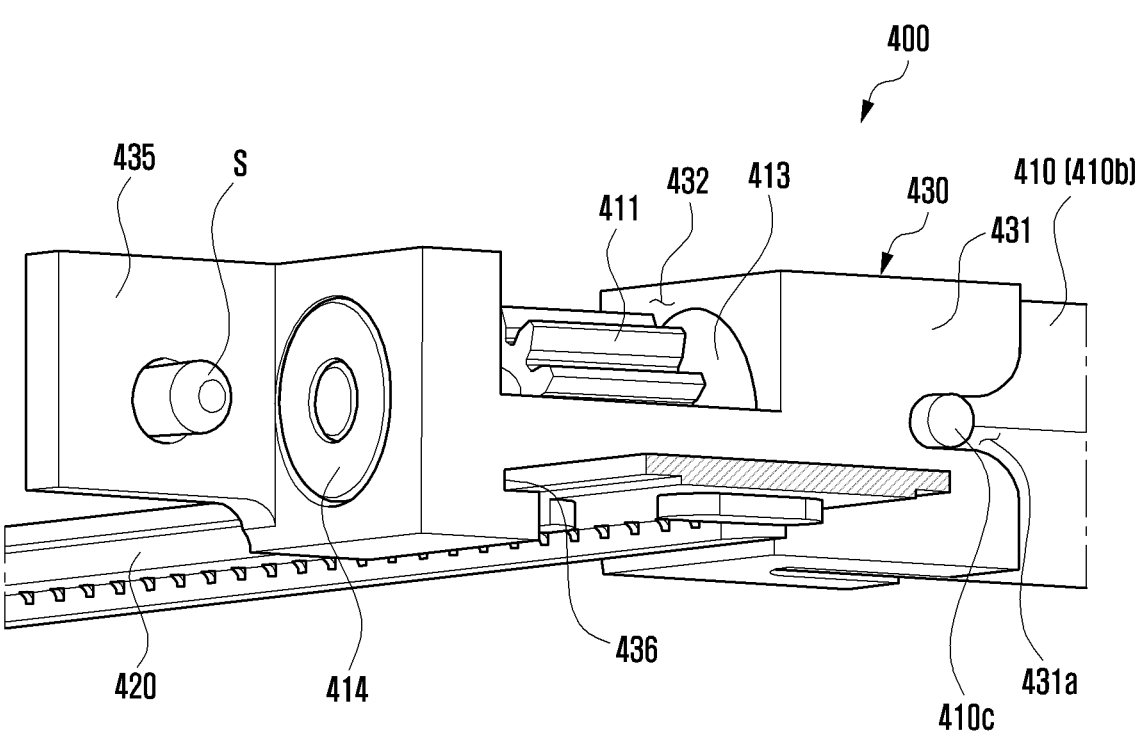
FIGS. 6E and 6F are diagrams illustrating a state in which a gear support member is coupled to a motor bracket according to various embodiments of the disclosure.
Figure 6F:
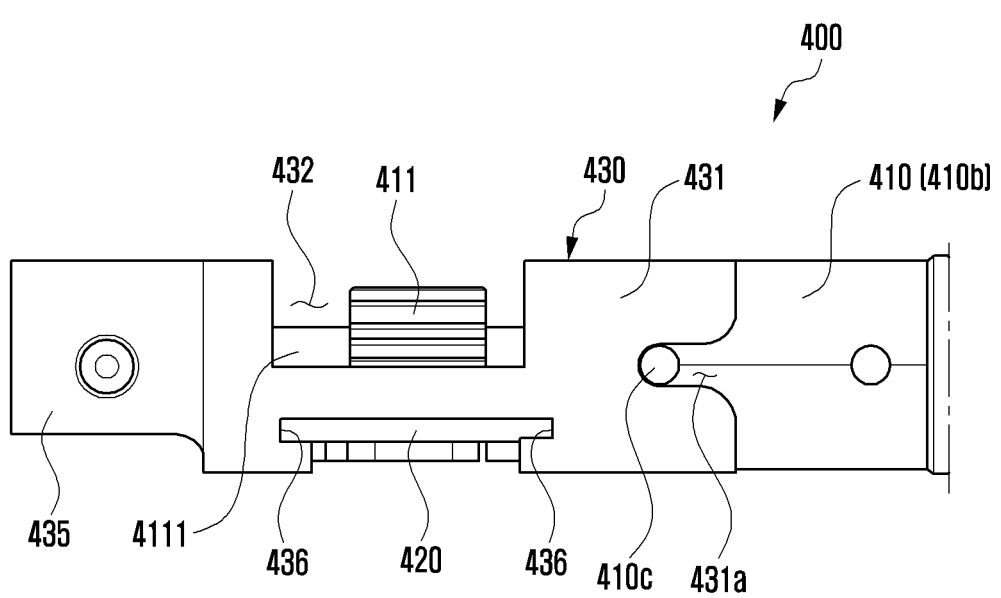

FIGS. 6E and 6F are diagrams illustrating a state in which a gear support member 420 is coupled to a motor bracket 430 according to various embodiments of the disclosure.

With reference to FIGS. 6E and 6F, the drive module 400 may have a modular structure in which the drive motor 410 and the gear support member 420 are coupled together through the motor bracket 430. In some embodiments, the drive module 400 may have a modular structure in which the shaft 4111 including the first gear 411 extends through the first and second through holes 433*a* and 433*b* to be assembled in the motor bracket 430. For example, the drive motor 410 may be finally assembled in the shaft 4111 of the modularized motor bracket 430. Through such a modular structure, the first gear 411 and the second gear 421 may be stably gear-coupled to help to improve operation reliability of the drive module 400.

According to various embodiments, the gear support member 420 is a plate type and opposing sideboth ends of the gear support member 420 may be slidably fixed to a pair of guide grooves 436 formed in the body 431 of the motor bracket 430. According to an embodiment, when the gear support member 420 is seated to be guided in the guide groove 436, the second gear 421 of the gear support member 420 may be naturally gear-coupled to the first gear 411 of the drive motor 410 exposed to the opening 434 of the motor bracket 430.

FIGS. 7A to 7D are diagrams illustrating a friction reduction structure between a motor housing and a gear support 420 member according to various embodiments of the disclosure.

Figure 7A:
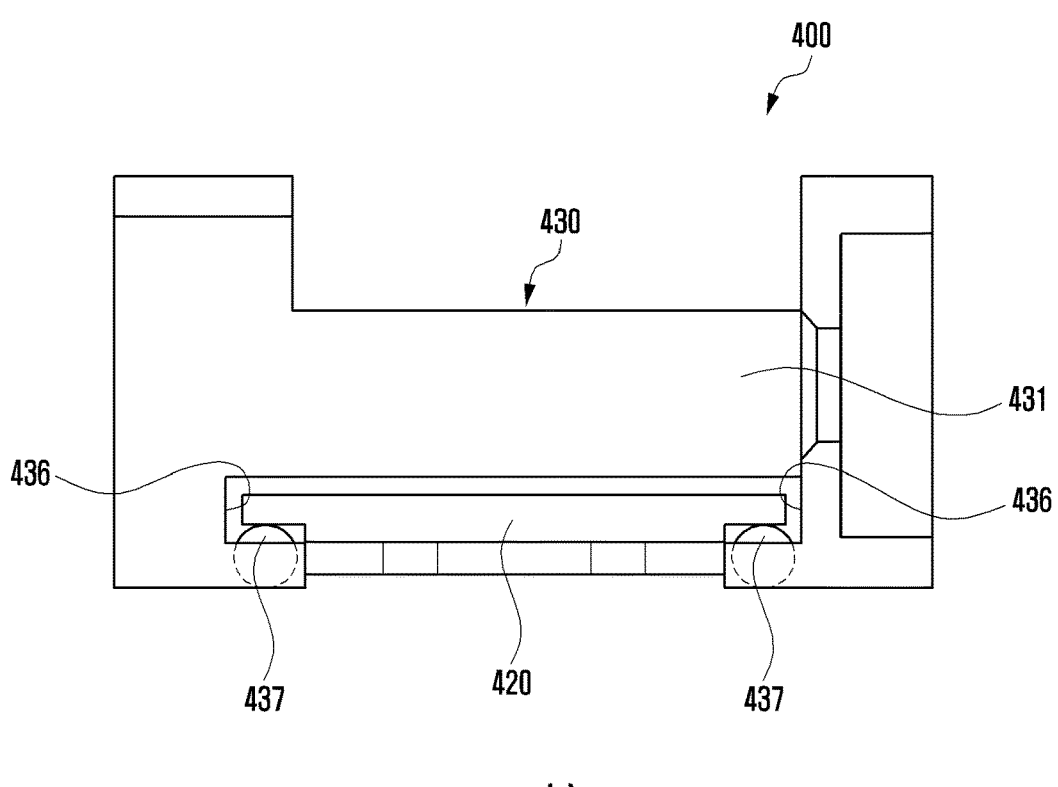
FIGS. 7A to 7D are diagrams illustrating a friction reduction structure between a motor housing and a gear support member according to various embodiments of the disclosure.
Figure 7A:
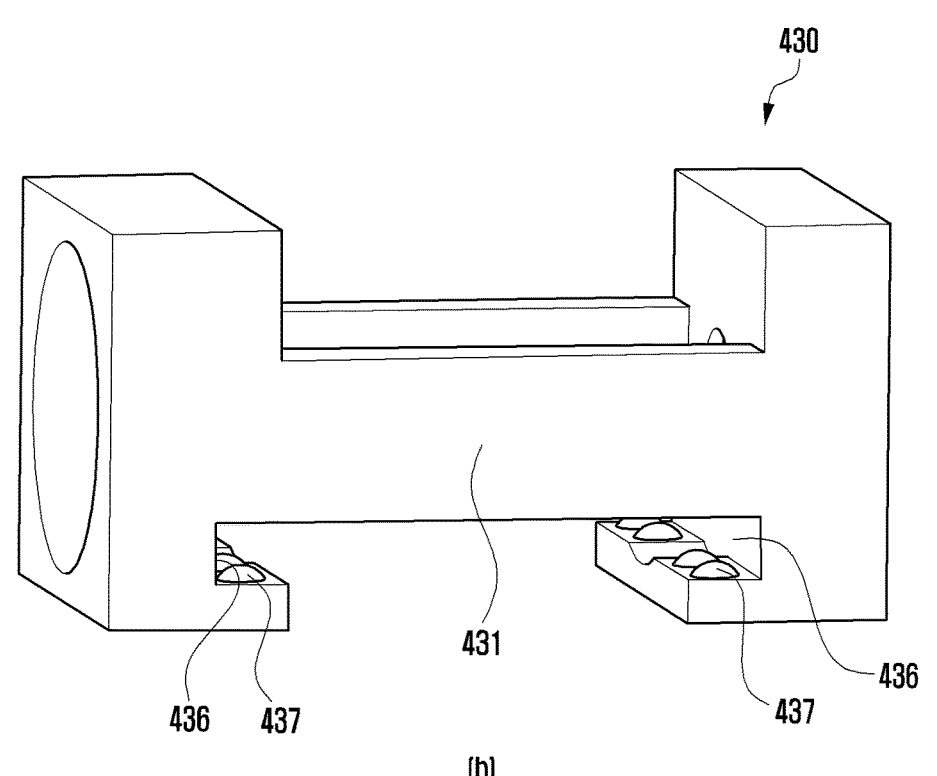

Part (a) of FIG. 7A is a front view illustrating a state in which the motor bracket 430 and the gear support member 420 are coupled, and part (b) of FIG. 7A is a perspective view illustrating the motor bracket 430.

With reference to FIG. 7A, the friction reduction structure may include at least one ball bearing 437 disposed between the guide groove 436 of the motor bracket 430 and the gear support member 420. According to an embodiment, the at least one ball bearing 437 may be disposed between contact surfaces in which the guide groove 436 of the motor bracket 430 and the gear support member 420 contact, thereby reducing frictional resistance between the two contact surfaces. For example, the at least one ball bearing 437 may be disposed at an inner surface of the guide groove 436 in contact with the gear support member 420. In some embodiments, the at least one ball bearing 437 may be disposed at a corresponding surface of the gear support member 420 in contact with the inner surface of the guide groove 436. In some embodiments, the at least one ball bearing 437 may be disposed at both the inner surface of the guide groove 436 and the gear support member 420. Here, the ball bearing 437 may be a discrete rolling element like a ball or roller rotatable along the sliding direction as the gear support member 420 slides along the guide grooves 436.

Figure 7B:
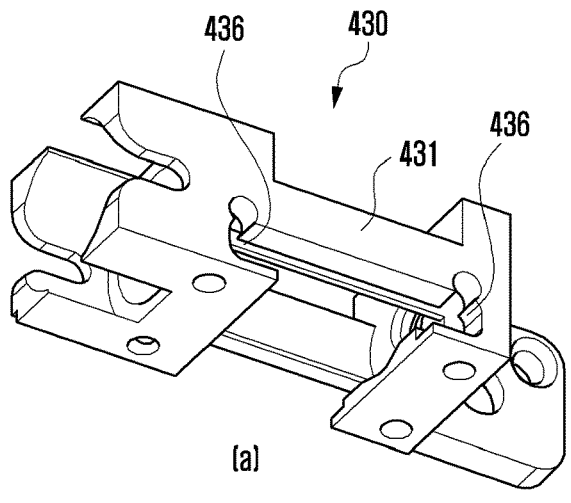
Figure 7B:
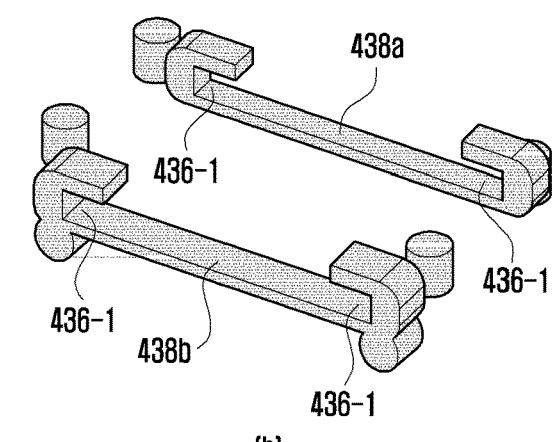
Figure 7B:
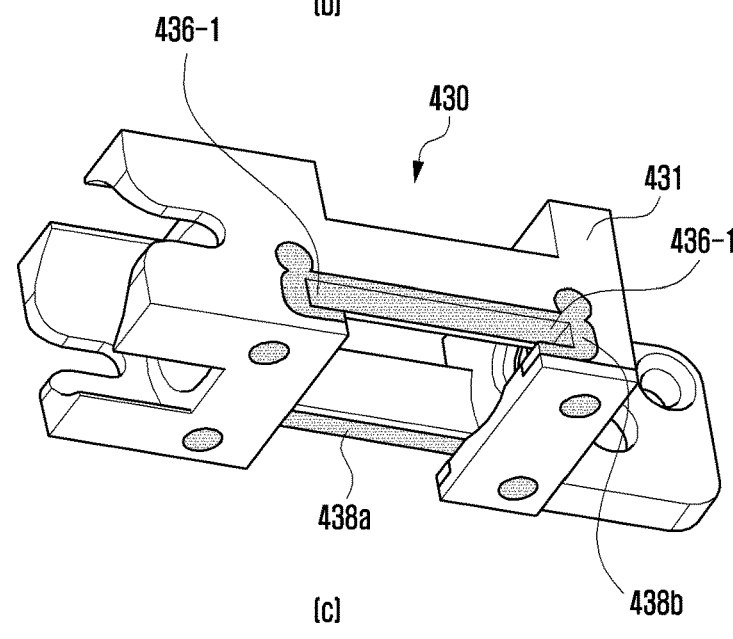

Part (a) of FIG. 7B is a perspective view illustrating the motor bracket 430, Part (b) of FIG. 7B is a perspective view illustrating friction reduction members 438*a* and 438*b*, and Part (c) of FIG. 7B is a perspective view illustrating a state in which the friction reduction members 438*a* and 438*b* are coupled to the motor bracket 430.

With reference to FIG. 7B, the friction reduction structure may include a motor bracket 430 defining the guide groove 436 and at least one friction reduction member 438*a* and 438*b* respective at opposing sides of the guide groove 436 and at which the gear support member (e.g., the gear support member 420 of FIG. 6A) slides relative to the motor bracket 430. Each of the friction reduction member 438*a* and 438*b* may include a guide sub-groove 436-1 for guiding opposing side ends of the gear support member 420. According to an embodiment, the at least one friction reduction member 438*a* and 438*b* may be made of a material (e.g., polyoxymethylene (POM)) for reducing frictional resistance in surface contact with the gear support member 420.

Figure 7C:
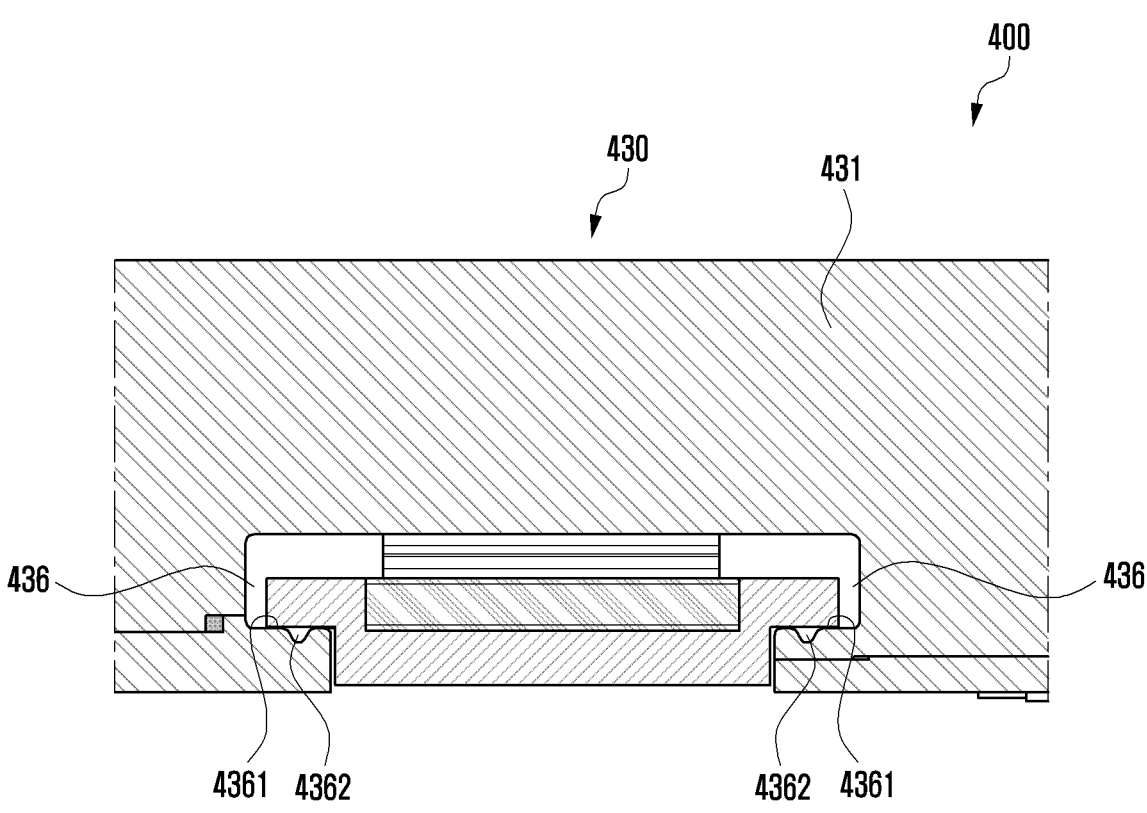

With reference to FIG. 7C, the friction reduction structure may include a friction reduction groove 4362 for reducing a contact area of a lower contact surface 4361 of the body 431 at the guide groove 436 which is in contact with the gear support member 420. According to an embodiment, a plurality of friction reducing grooves 4362 may be formed at designated intervals along the lower contact surface 4361 of the guide groove 436, such as along the sliding direction. Accordingly, a total area of the contact surface between the gear support member 420 and the guide groove 436 of the motor bracket 430 may be reduced, thereby reducing frictional resistance between the gear support member 420 and the motor bracket 430 at the guide groove 436.

Figure 7D:
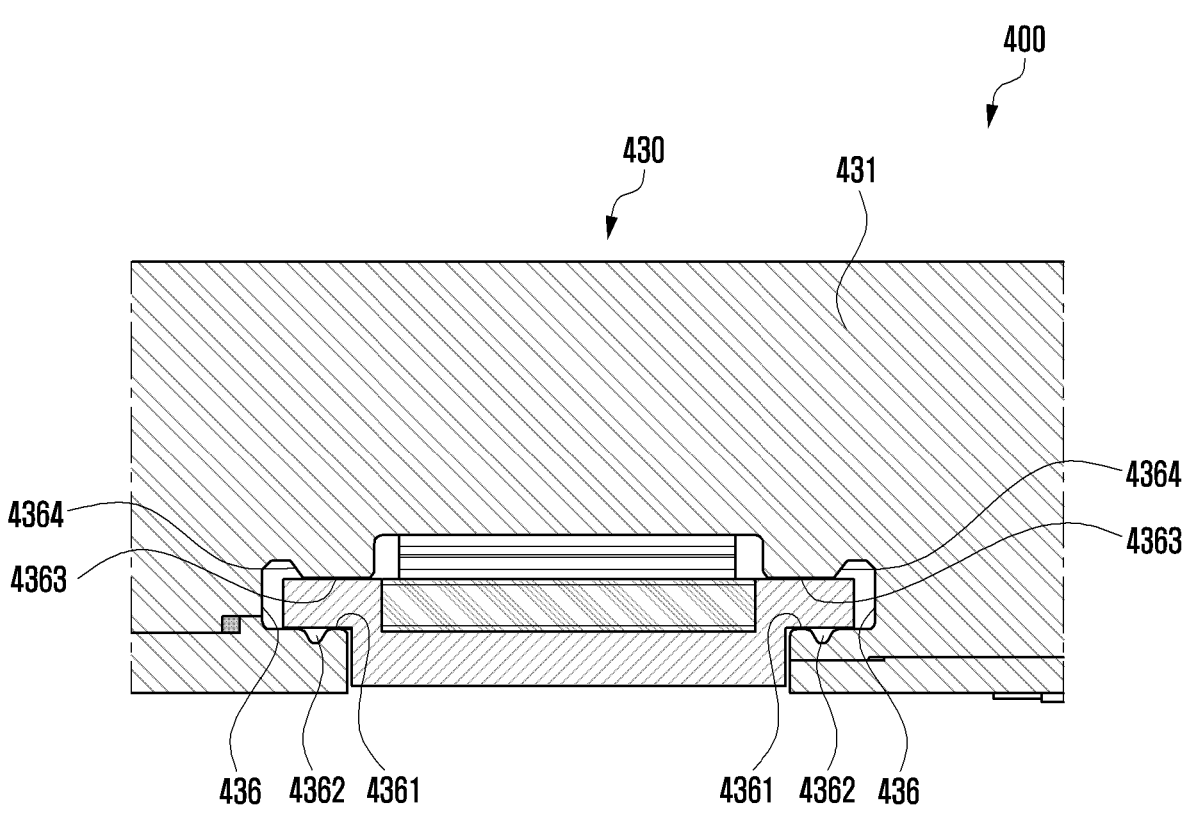

With reference to FIG. 7D, the friction reduction structure may include at least one friction reduction groove 4362 for reducing a contact area of the lower contact surface 4361 of the body 431 at the guide groove 436 which is in contact with the gear support member 420. According to an embodiment, in order to reduce a contact area of an upper contact surface 4363 of the body 431 at the guide groove 436 which is in contact with the gear support member 420, the friction reduction structure may include a cutting portion 4364 (e.g., a recess) of at least partially formed groove shape. Accordingly, a contact area of the contact surface between the gear support member 420 and the guide groove 436 of the motor bracket 430 may be reduced, thereby reducing frictional resistance between the gear support member 420 and the motor bracket 430 at the guide groove 436.

In some embodiments, the gear support member 420 and/or the guide groove 436 of the motor bracket 430 may include a coating layer (e.g., Teflon coating layer or hard coating layer) for reducing friction formed at the contact surface.

Figure 8A:
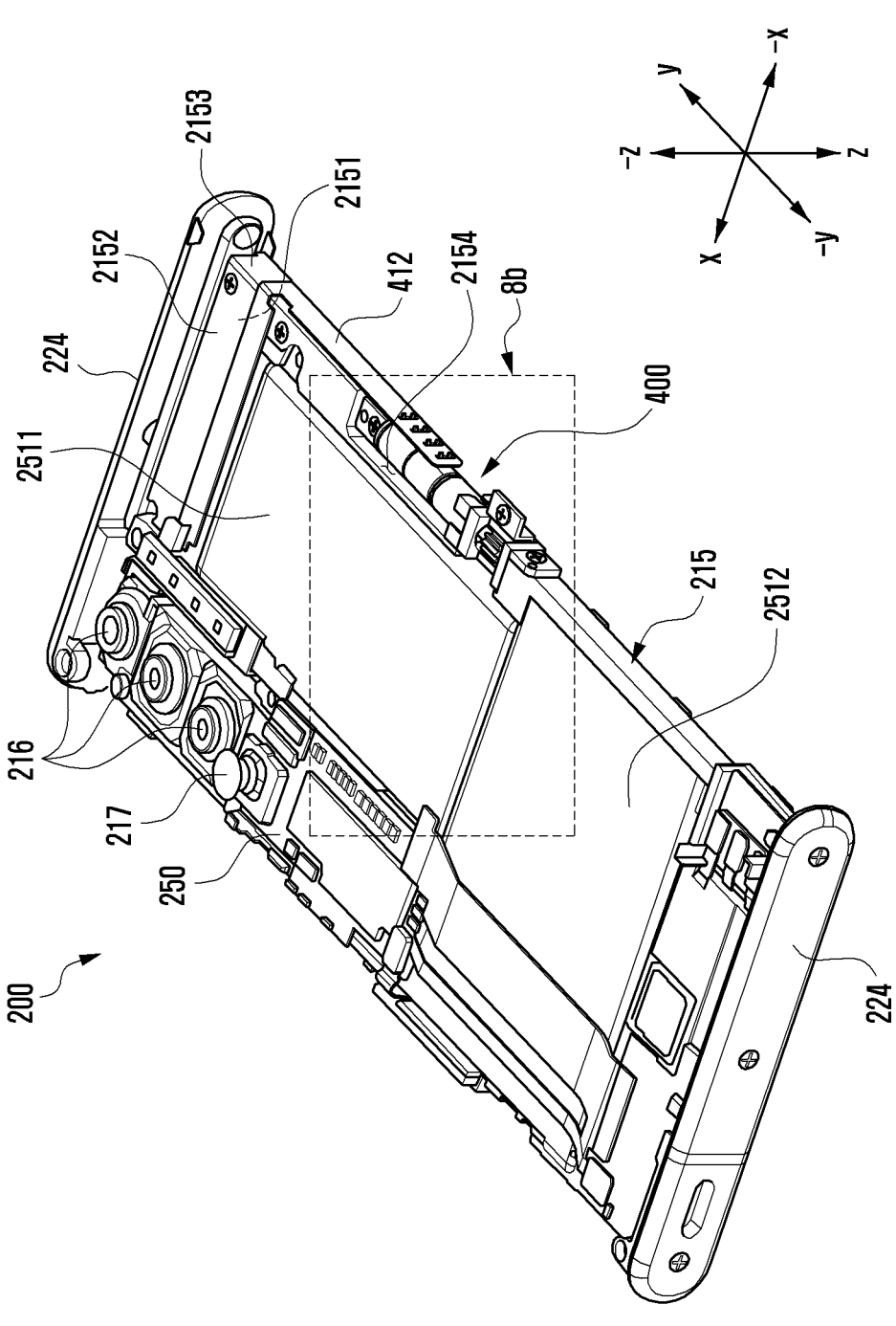
FIG. 8A is a perspective view illustrating an electronic device in which a drive module is disposed according to various embodiments of the disclosure.
Figure 8B:
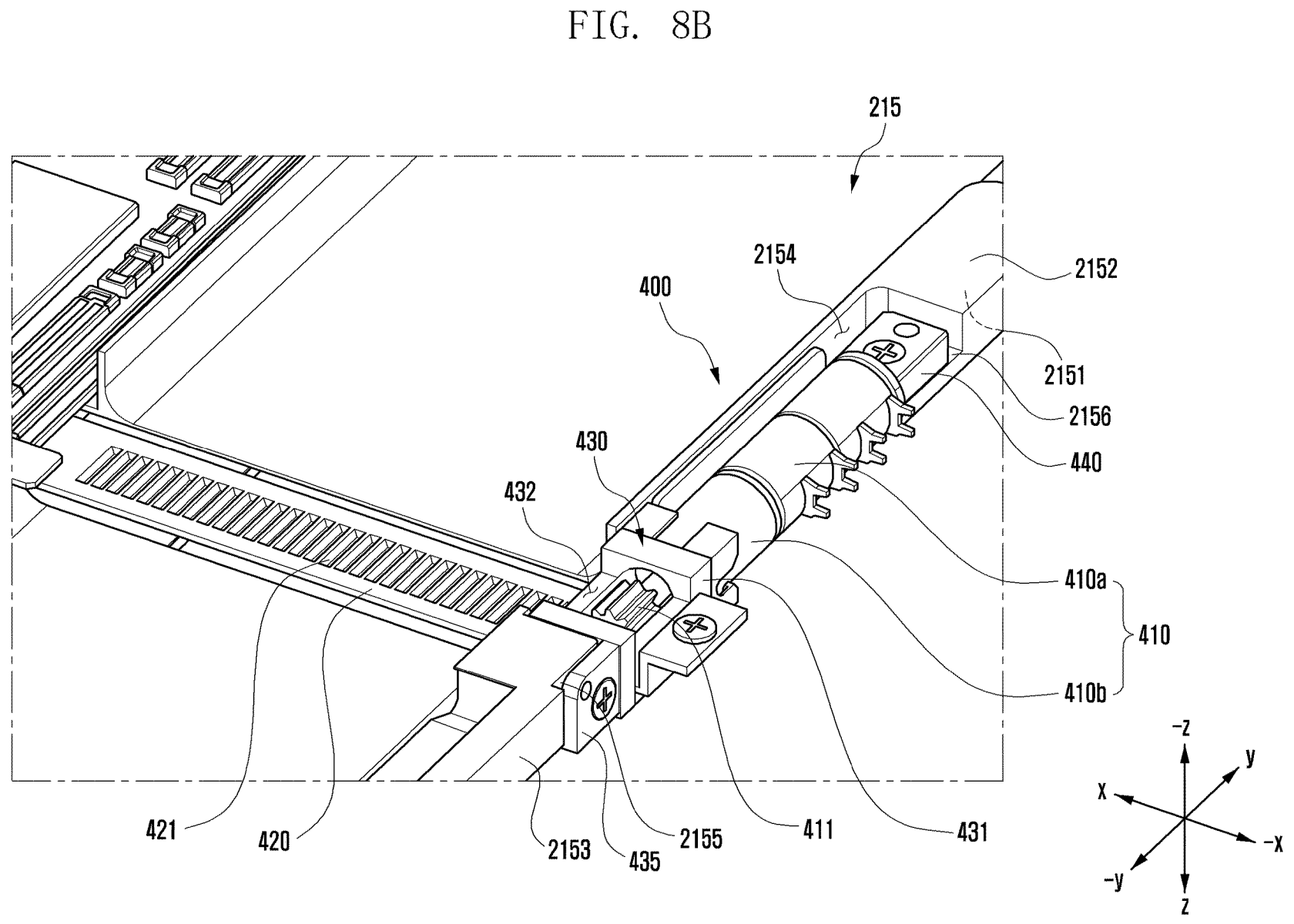

FIG. 8A is a perspective view illustrating an electronic device 200 in which a drive module 400 is disposed according to various embodiments of the disclosure. FIG. 8B is an enlarged view illustrating an area 8b of FIG. 8A according to various embodiments of the disclosure.

With reference to FIGS. 8A and 8B, the electronic device 200 may include a bracket housing 215 and a drive module 400 which is fixed to the first housing 210 at the bracket housing 215. According to an embodiment, the bracket housing 215 is a partial component of the first housing (e.g., the first housing 210 of FIG. 4) and may include a first surface 2151 facing in the first direction (Z-axis direction), a second surface 2152 facing in a direction (−Z-axis direction) opposite to the first surface 2151, and a side surface 2153 enclosing a space between the first surface 2151 and the second surface 2152. According to an embodiment, the bracket housing 215 may include at least one electronic component (e.g., the camera module 216, the sensor module 217, the substrate 250, and at least one battery 2511 and 2512) disposed in a space (e.g., the first space 2101 of FIG. 5A) provided at the second surface 2152.

According to various embodiments, the electronic device 200 may include a drive module 400 (e.g., the drive module 400 of FIG. 6A) disposed at the side surface 2153 of the bracket housing 215. According to an embodiment, the drive module 400 may be fixed to the first housing 210 at the side surface 2153, through the fixing part 435 extended from the body 431 of the motor bracket 430. According to an embodiment, the drive module 400 may be fixed to the side surface 2153 of the bracket housing 215 through the dummy bracket 440 supporting the drive motor 410. According to an embodiment, the drive module 400 may be disposed to be received in the receiving part 2154 (e.g., recess) formed to be lower than the side surface 2153 of the bracket housing 215. According to an embodiment, the fixing part 435 may be formed to be lower than the side surface 2153, and be fixed to a first stepped part 2155 (e.g., a recess) extended from the receiving part 2154 through the fastening member S (e.g., screw). According to an embodiment, the dummy bracket 440 supporting one end of the drive motor 410 may be formed to be lower than the second surface 2152, and be fixed to a second stepped part 2156 extended from the receiving part 2154 through the fastening member S (e.g., screw).

According to various embodiments, when the side surface 2153 of the bracket housing 215 is viewed from the outside, the drive module 400 may be formed in a size that does not protrude upward or downward relative to the side surface 2153, along the Z-axis direction (e.g., thickness direction). For example, when the drive module 400 is fixed to the side surface 2153, the drive module 400 may be disposed not to be higher (e.g., not protrude further) than the first surface 2151 in a direction (Z-axis direction) in which the first surface 2151 faces from the receiving part 2154 and be disposed not to be higher than the second surface 2152 in a direction (−Z-axis direction) in which the second surface 2152 faces. That is, the drive module 400 may be coplanar with the side surface 2153 of the first housing 210 at the bracket housing 215.

According to an embodiment, the fixing part 435 of the motor bracket 430 may be fixed to the first stepped part 2155 of the side surface 2153 through the fastening member S fastened in a direction (X-axis direction) facing the side surface 2153. The dummy bracket 440 may be fixed to the second stepped part 2156 of the side surface 2153 through the fastening member S fastened in a direction (Z-axis direction) of the first surface 2151 from the second surface 2152. For example, the drive module 400 may be fixed to the side surface 2153 of the bracket housing 215 using the dummy bracket 440 and the fixing part 435 of the motor bracket 430 through the fastening members S fastened or extended in different directions (e.g., X-axis direction and Z-axis direction), thereby helping in improving efficiency of a disposition structure for decrease in thickness of the electronic device 200 and providing improved safety for preventing shaking when operating the drive motor 410. In some embodiments, the dummy bracket 440 and the fixing part 435 of the motor bracket 430 may be fastened to the side surface 2153 in substantially the same fastening direction (e.g., X-axis direction or Z-axis direction) through the fastening member S. According to an embodiment, the motor FPCB 412 may have an electrical connection structure by having one end electrically connected to at least one conductive terminal 410d disposed at the outer circumferential surface of the drive motor 410 and the other end extended to the substrate 250 disposed in the bracket housing 215 of the electronic device 200.

Figure 9A:
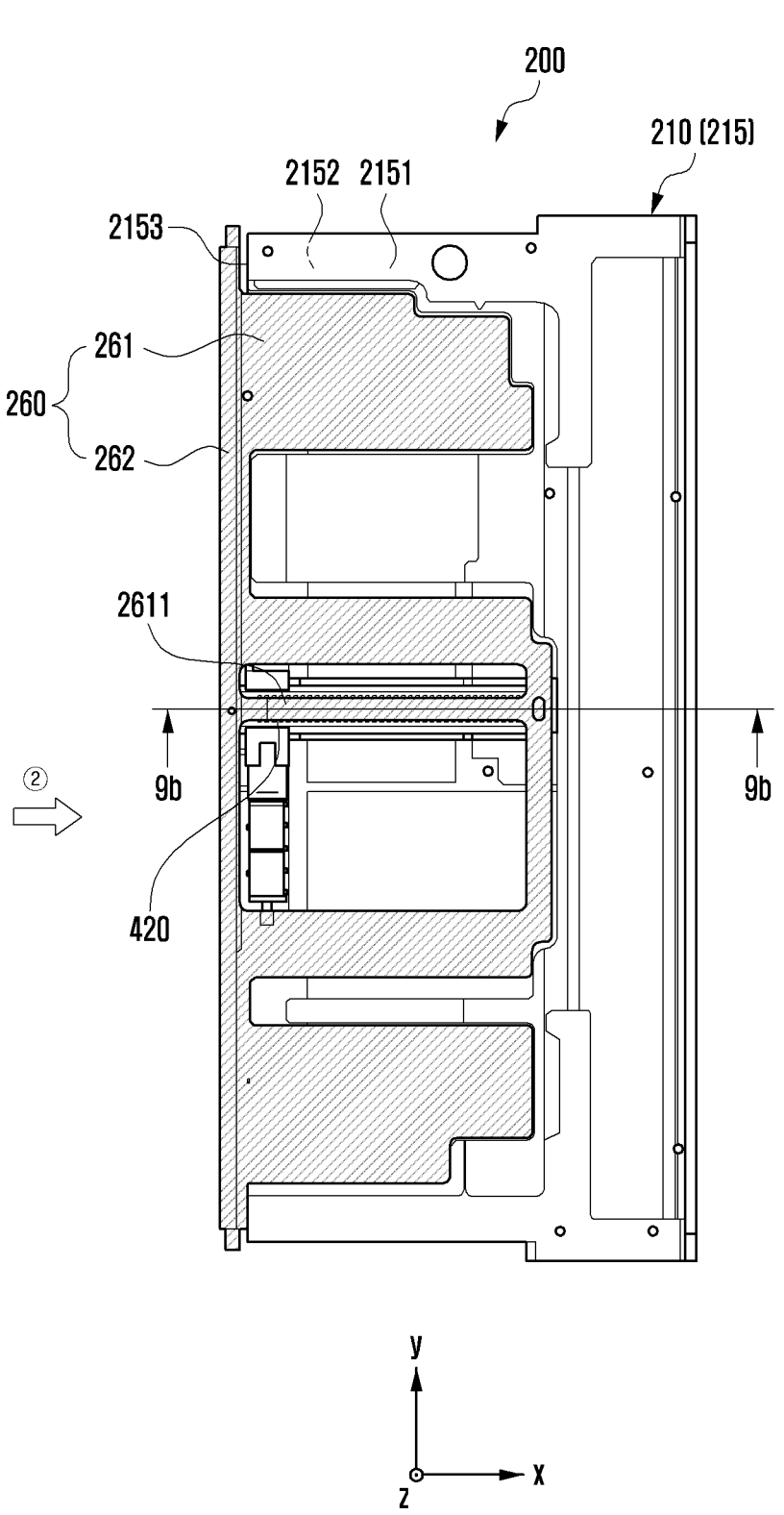
FIG. 9A is a diagram illustrating a disposition relationship between a bracket housing and a sliding frame in a slide-in state according to various embodiments of the disclosure.
Figure 9B:
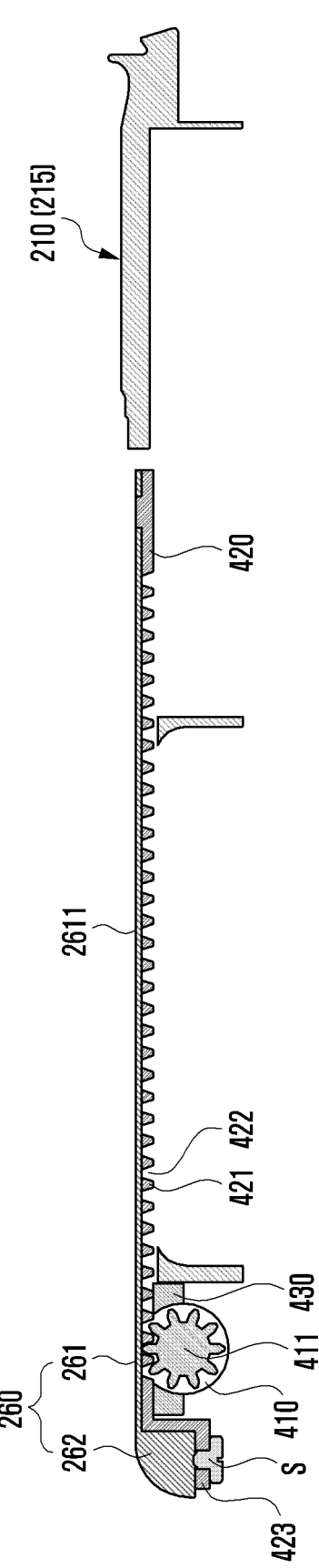
FIG. 9B is a cross-sectional view illustrating an electronic device taken along line 9b-9b of FIG. 9A according to various embodiments of the disclosure.
Figure 9C:
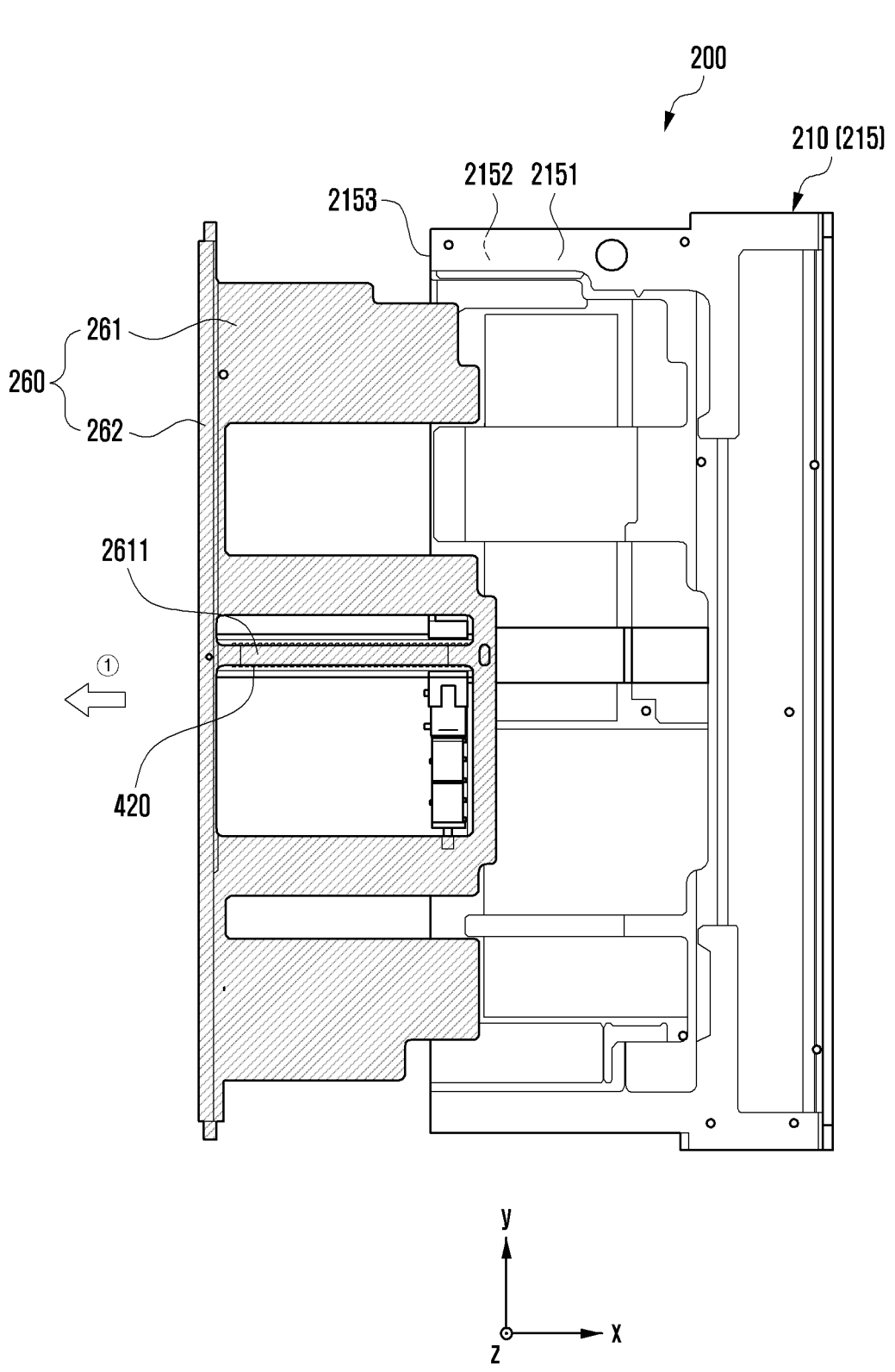
FIG. 9C is a diagram illustrating a disposition relationship between a bracket housing and a sliding frame in a slide-out state according to various embodiments of the disclosure.

FIG. 9A is a diagram illustrating a disposition relationship between a bracket housing 215 and a sliding frame 260 in a slide-in state according to various embodiments of the disclosure. FIG. 9B is a cross-sectional view illustrating an electronic device 200 taken along line 9b-9b of FIG. 9A according to various embodiments of the disclosure. FIG. 9C is a diagram illustrating a disposition relationship between a bracket housing 215 and a sliding frame 260 in a slide-out state according to various embodiments of the disclosure.

With reference to FIGS. 9A to 9C, the electronic device 200 may include a bracket housing 215 (e.g., first housing) including a first surface 2151, a second surface 2152 facing in a direction opposite to the first surface 2151, and a side surface 2153 enclosing a space between the first surface 2151 and the second surface 2152, and a sliding frame 260 slidably coupled to the bracket housing 215. According to an embodiment, the sliding frame 260 may include a plate 261 substantially facing the first surface 2151 of the bracket housing 215, and a sliding bar 262 extended from the plate 261 and for supporting a rear surface of the support member (e.g., the support member 240 of FIG. 4). According to an embodiment, the gear support member 420 may be disposed at the plate 261 of the sliding frame 260, between the sliding frame 261 and the bracket housing 215. According to an embodiment, the gear support member 420 may be disposed to be supported by a support 2611 (e.g., support bar) formed in at least a partial area of the plate 261. In this case, since a base structure supporting the second gear 421 is essential, it may be difficult to reduce the thickness of the gear support member 420, thus, the gear support member 420 may work against decrease in thickness of the electronic device 200. Further, when the support 2611 is removed to reduce the thickness, the sliding frame 260 does not support the gear support member 420, thus, operational reliability of the gear-coupled two gears (e.g., the first gear 411 and the second gear 421) may be deteriorated.

According to various embodiments, the gear support member 420 may include or define a plurality of through holes 422 spaced apart from each other at designated intervals, by solid portions of the gear support member 420. According to an embodiment, the gear support member 420 may form the second gear 421 using a separation portion as the solid portions which define the plurality of through holes 422 therebetween. According to an embodiment, a cross-section of the plurality of through holes 422 may be formed to have a conical structure corresponding to a shape of the second gear 421. According to an embodiment, a thickness of the gear support member 420 along the thickness direction may be minimized by replacing the base structure supporting the second gear 421 formed by the through holes 422 with the support 2611 formed in or by the plate 261.

Figure 10:
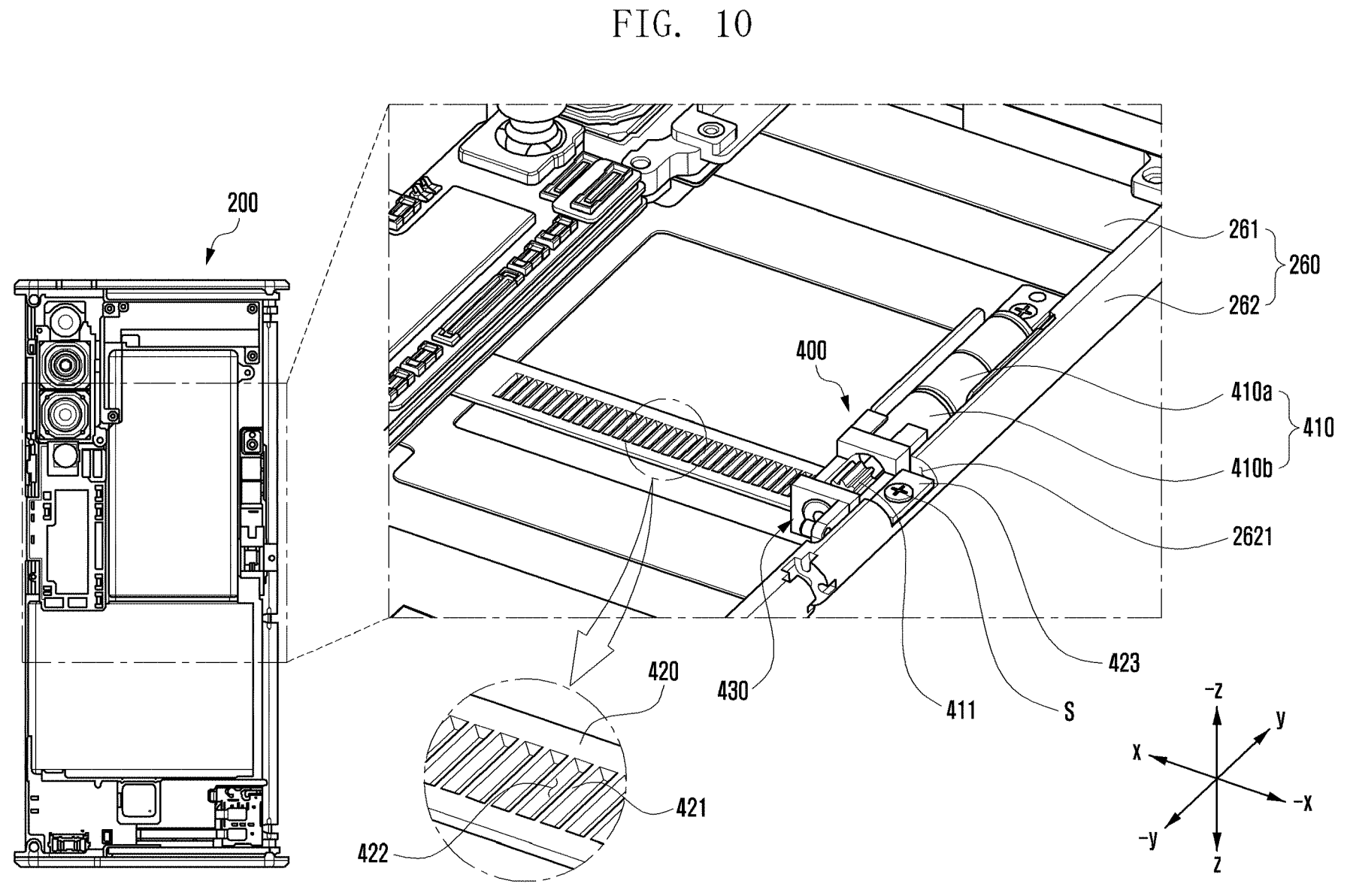

FIG. 10 is diagrams illustrating a coupling structure between a gear support member 420 and a sliding frame 260 according to various embodiments of the disclosure.

With reference to FIG. 10, the electronic device 200 may include a bracket housing 215, a sliding bar 262 slidably coupled to the bracket housing 215 and extended from the plate 261, and a drive module 400 disposed in the bracket housing 215 and the sliding frame 260. According to an embodiment, the drive module 400 may drive the sliding frame 260 relative to the bracket housing 215 in a slide-out direction (–X-axis direction) or a slide-in direction (X-axis direction). According to an embodiment, the drive module 400 may include a drive motor 410 including a first gear 411 fixed to the bracket housing 215, and a gear support member 420 including a second gear 421 gear-coupled to the first gear 411 and fixed to the sliding frame 260. According to an embodiment, the gear support member 420 may be supported through the plate 261 of the sliding frame 260, and an end portion 423 may be fastened to the sliding bar 262 through the fastening member S (e.g., screw). According to an embodiment, the sliding bar 262 may include a recess 2621 formed to be lower than the outer surface thereof, and the end portion 423 of the gear support member 420 may be seated on the recess 2621 and then be fixed through the fastening member S. In this case, the end portion 423 of the gear support member 420 does not protrude to an outer surface of the sliding bar 262, thereby helping decrease in thickness of the electronic device 200 and to improve operational stability of the electronic device 200.

Figure 11A:
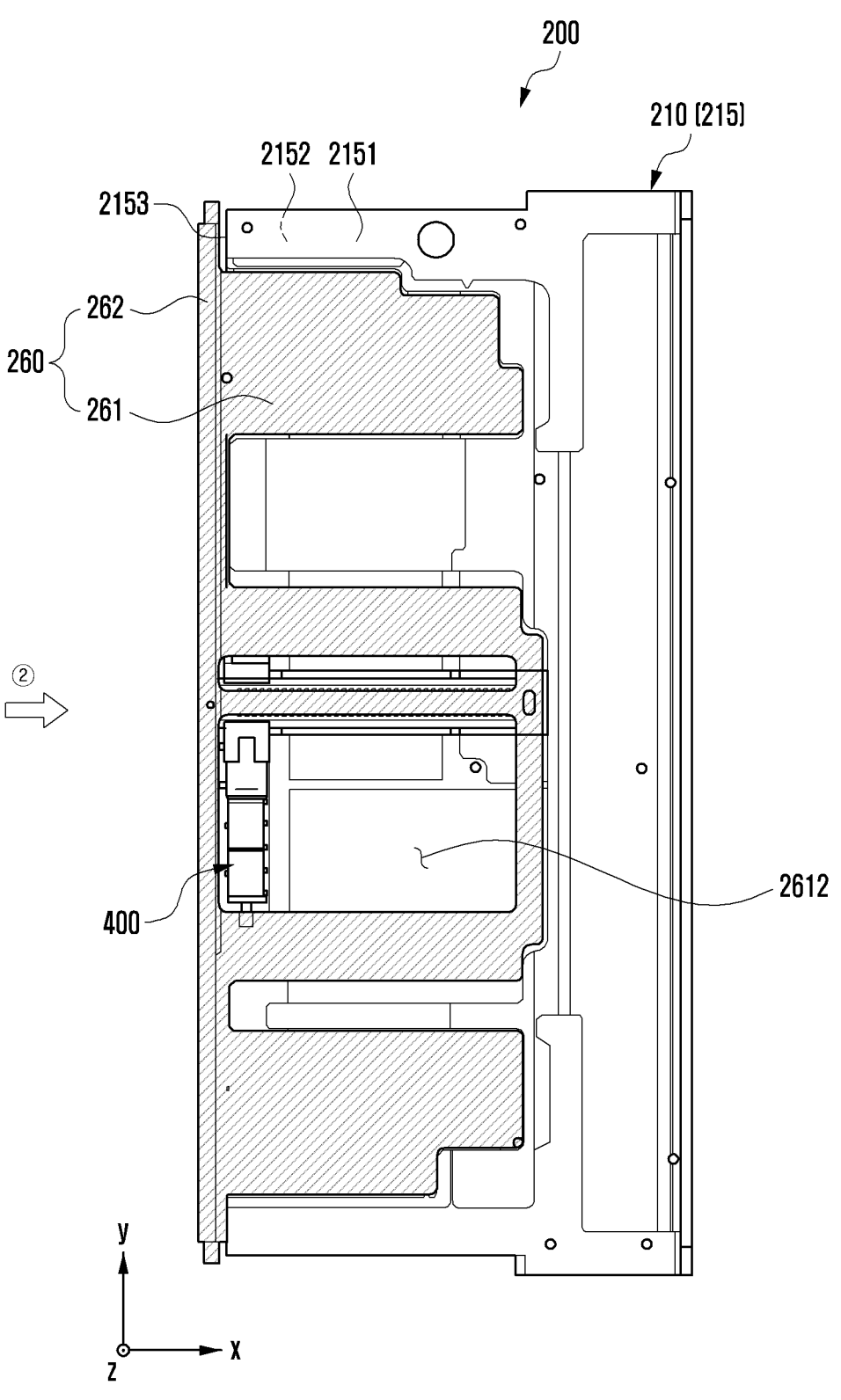
FIG. 11A is a diagram illustrating a disposition position of a drive module in the case that a bracket housing and a sliding frame are coupled according to various embodiments of the disclosure.
Figure 11B:
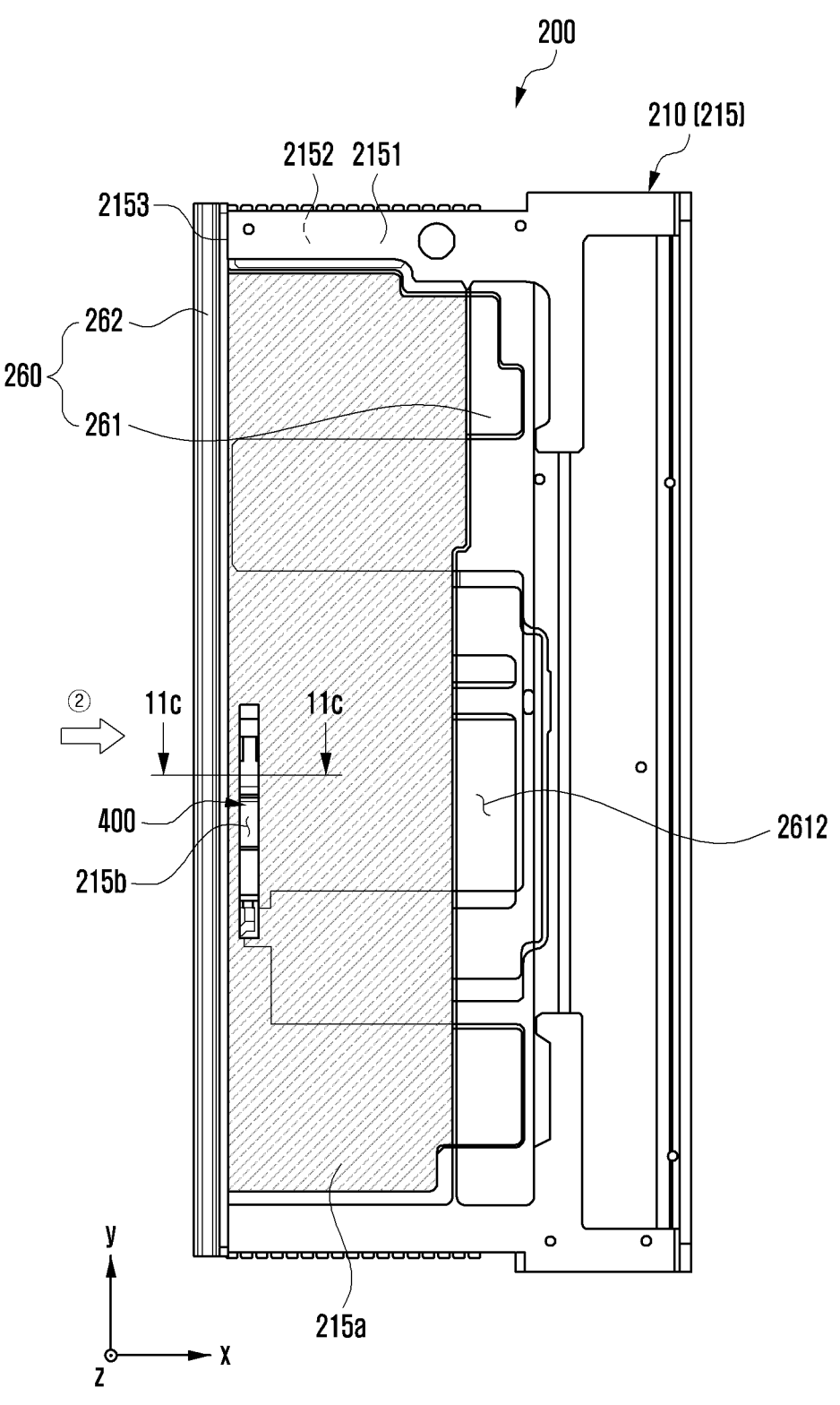
FIG. 11B is a diagram illustrating a state in which an auxiliary cover is disposed in a bracket housing according to various embodiments of the disclosure.
Figure 11C:
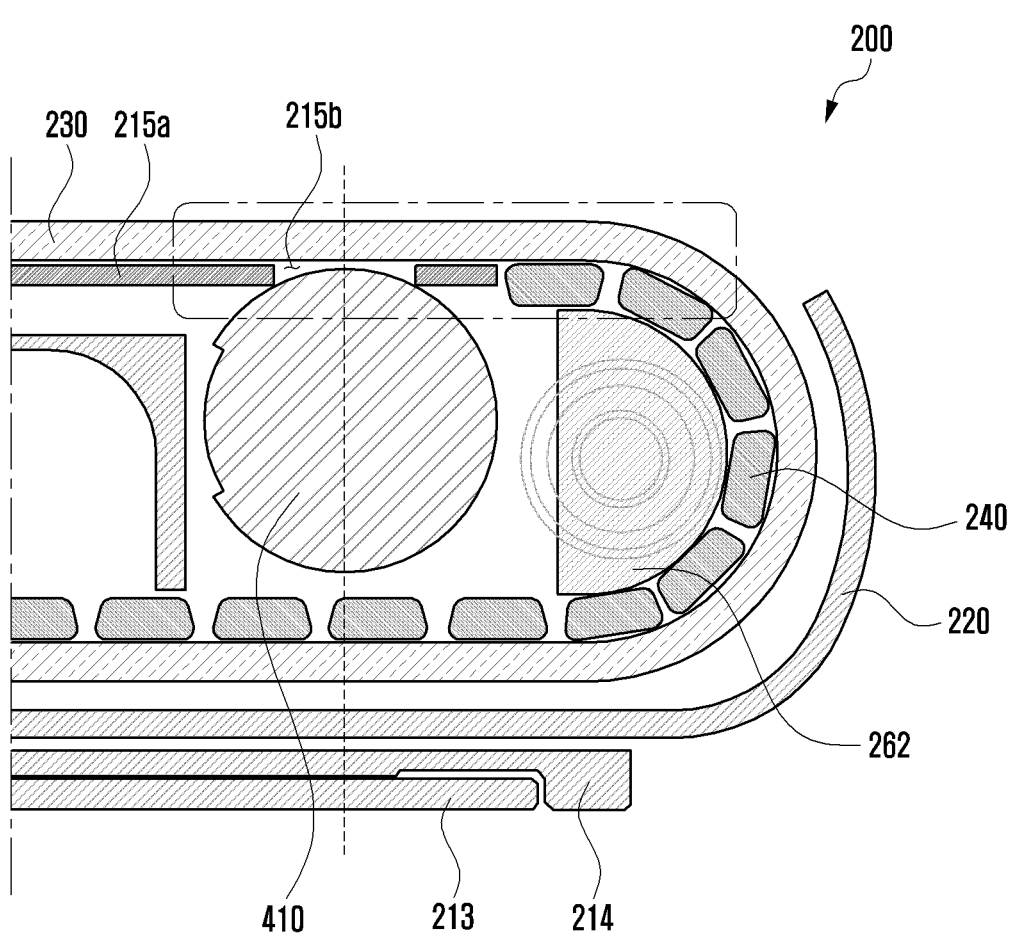
FIG. 11C is a partial cross-sectional view illustrating an electronic device taken along line 11c-11c of FIG. 11B according to various embodiments of the disclosure.

FIG. 11A is a diagram illustrating a disposition position of a drive module 400 in the case that a bracket housing 215 and a sliding frame 260 are coupled according to various embodiments of the disclosure. FIG. 11B is a diagram illustrating a state in which an auxiliary cover 215a is disposed in a bracket housing 215 according to various embodiments of the disclosure. FIG. 11C is a partial cross-sectional view illustrating an electronic device 200 taken along line 11c-11c of FIG. 11B according to various embodiments of the disclosure.

With reference to FIGS. 11A to 11C, the electronic device 200 may include a bracket housing 215 (e.g., first housing) including a first surface 2151, a second surface 2152 facing in a direction opposite to the first surface 2151, and a side surface 2153 enclosing a space between the first surface 2151 and the second surface 2152, and a sliding frame 260 slidably coupled to the bracket housing 215. According to an embodiment, the sliding frame 260 may include a plate 261 substantially facing the first surface 2151 of the bracket housing 215, and a sliding bar 262 extended from the plate 261 and for supporting a rear surface of the support member (e.g., the support member 240 of FIG. 4). According to an embodiment, the electronic device 200 may include an auxiliary cover 215a disposed to correspond to the first surface 2151 of the bracket housing 215. According to an embodiment, the plate 261 of the sliding frame 260 may be disposed at the first surface 2151 between the first surface 2151 of the bracket housing 215 and the auxiliary cover 215a. According to an embodiment, the auxiliary cover 215a may provide a flat surface for the flexible display 230 disposed thereon.

According to various embodiments, the drive module 400 fixed to the side surface 2153 of the bracket housing 215 may be exposed in a direction (Z-axis direction) in which the first surface 2151 faces through an opening 2612 formed in the plate 261. According to an embodiment, the auxiliary cover 215a may include a receiving hole 215b disposed at a position corresponding to the drive module 400. According to an embodiment, at least a portion of the drive module 400 fixed to the side surface 2153 of the bracket housing 215 may be at least partially received through the receiving hole 215b. For example, the drive module 400 may be received through the receiving hole 215b, but may be disposed to not contact the flexible display 230 disposed thereon. Accordingly, a stacking height of the drive module 400 is reduced through partial reception of the drive module 400 through the receiving hole 215b, thereby helping decrease in thickness of the electronic device 200. In some embodiments, the auxiliary cover 215a may be replaced with a receiving groove formed lower than the outer surface instead of the receiving hole 215b.

Figure 12A:
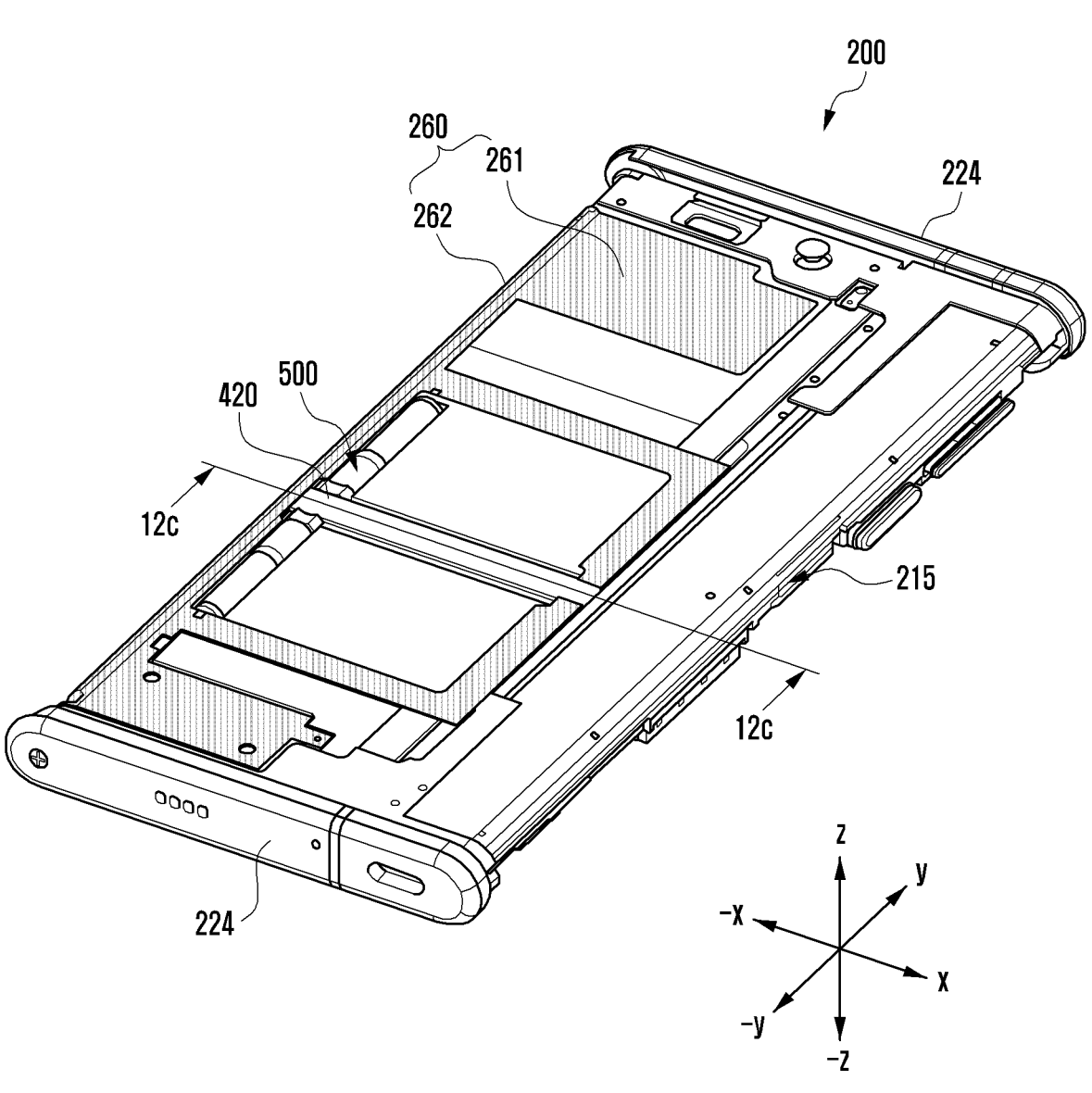
FIG. 12A is a front perspective view illustrating an electronic device in which a drive module is disposed according to various embodiments of the disclosure.
Figure 12B:
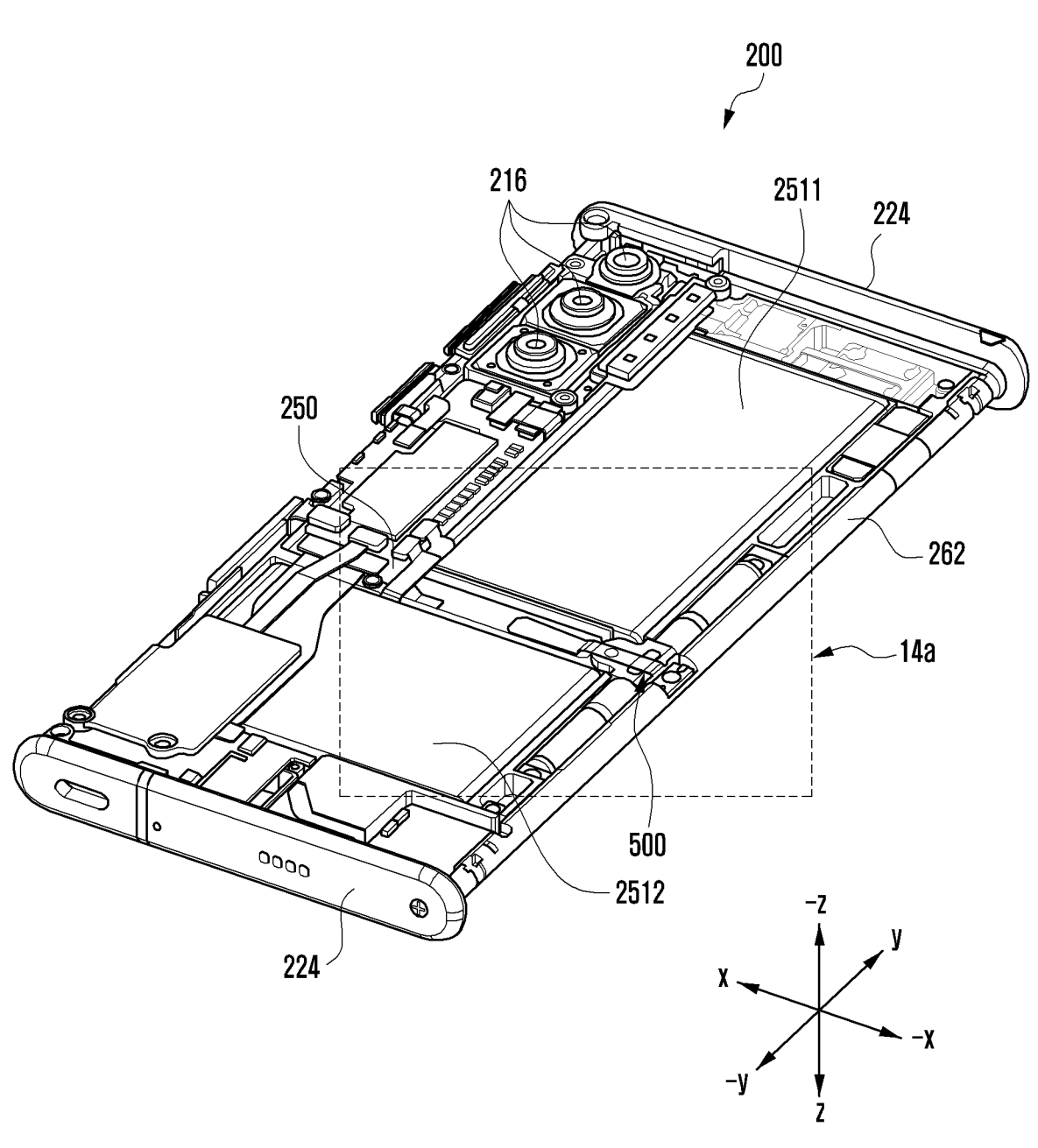
FIG. 12B is a rear perspective view illustrating an electronic device in which a drive module is disposed according to various embodiments of the disclosure.
Figure 12C:
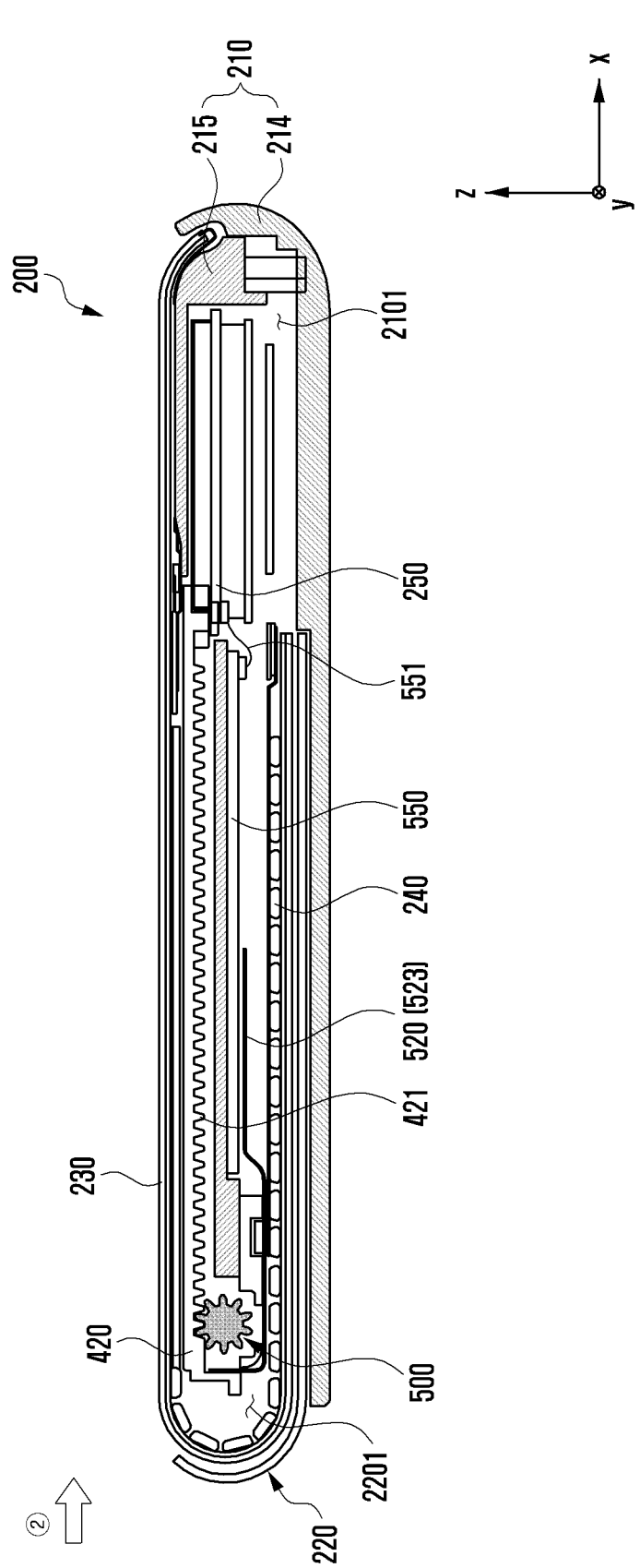
FIG. 12C is a cross-sectional view illustrating an electronic device in a slide-in state viewed along line 12c-12c of FIG. 12A according to various embodiments of the disclosure.
Figure 12D:
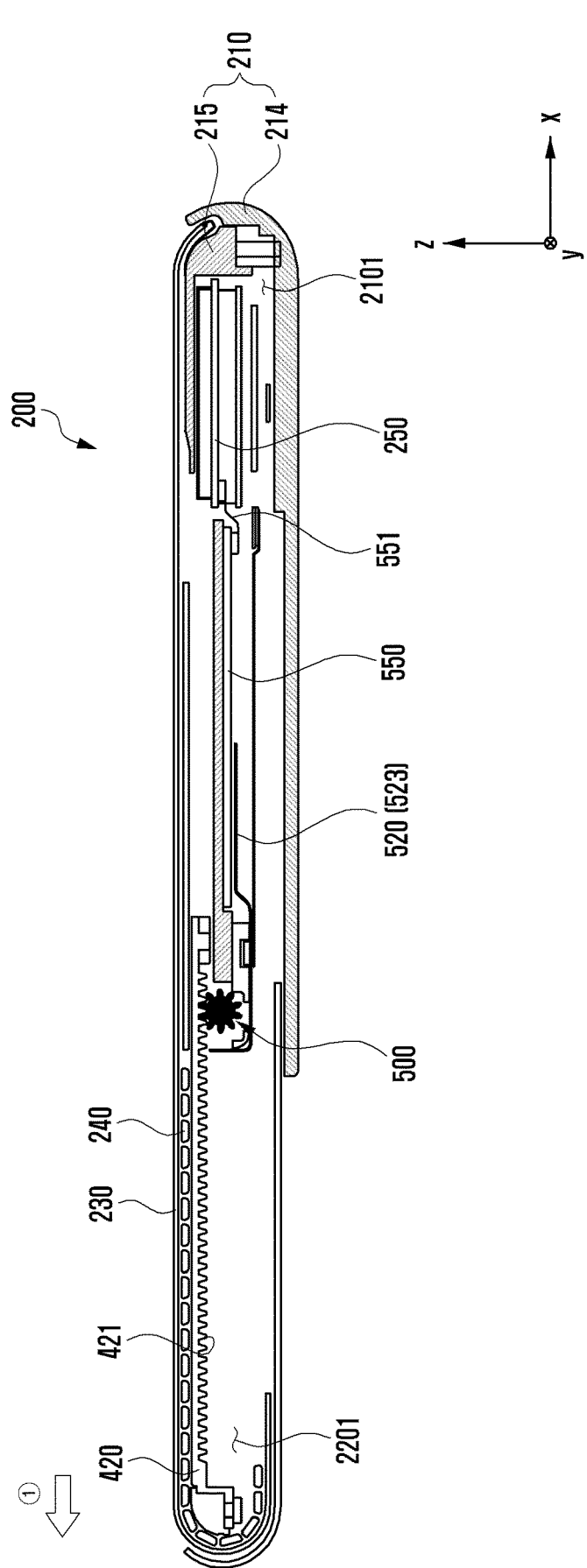
FIG. 12D is a cross-sectional view of an electronic device illustrating a slide-out state according to various embodiments of the disclosure.

FIG. 12A is a front perspective view illustrating an electronic device 200 in which a drive module 400 is disposed according to various embodiments of the disclosure. FIG. 12B is a rear perspective view illustrating an electronic device in which a drive module is disposed according to various embodiments of the disclosure. FIG. 12C is a cross-sectional view illustrating an electronic device in a slide-in state viewed along line 12c-12c of FIG. 12A according to various embodiments of the disclosure. FIG. 12D is a cross-sectional view of an electronic device illustrating a slide-out state according to various embodiments of the disclosure.

The electronic device 200 of FIGS. 12A and 12B illustrates an internal structure without the cover housing (e.g., the cover housing 214 of FIG. 12C) and the flexible display (e.g., the flexible display 230 of FIG. 12C).

In the electronic device 200 of FIGS. 12A to 12D, a disposition structure of the drive module 500 may be substantially the same as the disposition structure of the drive module 400, as described above, and repeated descriptions may be omitted.

With reference to FIGS. 12A to 12D, the electronic device 200 (e.g., the electronic device 101 of FIG. 1) may include a bracket housing 215, a sliding frame 260 slidably coupled to the bracket housing 215, and a drive module 500 disposed in the bracket housing 215 and the sliding frame 260. According to an embodiment, the drive module 500 may include a first drive motor (e.g., the first drive motor 410 of FIG. 13B) including a first gear (e.g., the first gear 411 of FIG. 13B) disposed to have a series disposition structure in the bracket housing 215, a second drive motor (e.g., the second drive motor 510 of FIG. 13B) including a second gear (e.g., the second gear 511 of FIG. 13B), and a gear support member 420 including a third gear 421 (e.g., the second gear 421 of FIG. 5A) gear-coupled to the first gear 411 and the second gear 511. According to an embodiment, the first drive motor 410 and the second drive motor 510 may be driven at the same time, and provide an improved driving force to the gear support member 420. This may be advantageous in the case that a repulsive force of the flexible display 230 increases as the thickness of the electronic device 200 becomes thinner, thus, a high driving force is required.

According to various embodiments, the drive module 500 may include a motor FPCB 520 (e.g., the third portion 523 of FIG. 13A) electrically connected to the first drive motor 410 and the second drive motor 510. According to an embodiment, the motor FPCB 520 may be electrically connected to a motor PCB 550 disposed in the first space 2101 of the first housing 210. According to an embodiment, the motor PCB 550 may be electrically connected to the substrate 250 disposed in the first space 2101 through a connector FPCB 551. In some embodiments, the motor FPCB 550 may be directly electrically connected to the substrate 250 disposed in the first space 2101.

Figure 13A:
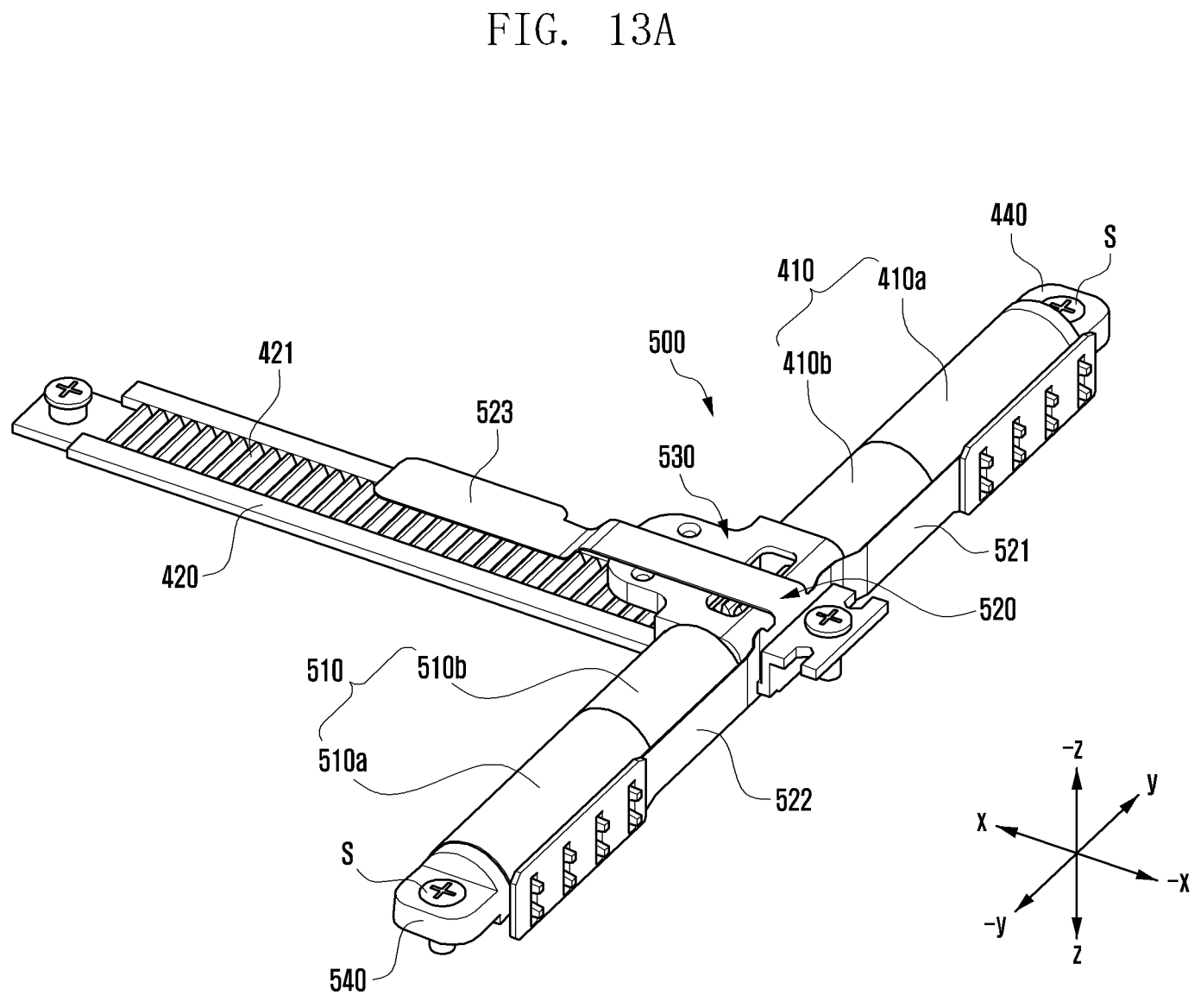
Figure 13B:
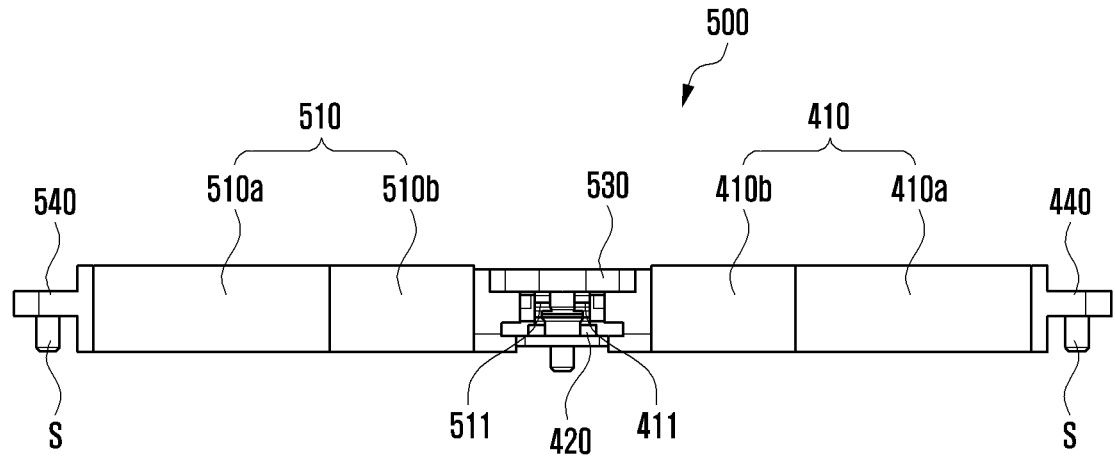

FIGS. 13A and 13B are diagrams illustrating a drive module 500 according to various embodiments of the disclosure.

With reference to FIGS. 13A and 13B, the drive module 500 may include a first drive motor 410, a second drive motor 510 disposed to have a series disposition structure with the first drive motor 410, and a gear support member 420 disposed to simultaneously receive a driving force of the first drive motor 410 and the second drive motor 510. According to an embodiment, the first drive motor 410 may include a first motor unit 410*a*, a first deceleration unit 410*b* connected to the first motor unit 410*a*, and a first gear 411 (e.g., pinion gear) rotatably coupled through the first deceleration unit 410*b*. According to an embodiment, the second drive motor 510 may include a second motor unit 510*a*, a second deceleration unit 510*b* connected to the second motor unit 510*a*, and a second gear 511 (e.g., pinion gear) rotatably coupled through the second deceleration unit 510*b*. According to an embodiment, the first drive motor 410 and the second drive motor 510 may be supported through one motor bracket 530. According to an embodiment, the first drive motor 410 and the second drive motor 510 may have a left-right symmetric series disposition structure based on the motor bracket 530.

According to an embodiment, the gear support member 420 may include a third gear 421 (e.g., the second gear 421 of FIG. 6A) slidably coupled to the motor bracket 530 in a sliding direction (e.g., the X-axis direction or the –X-axis direction of FIG. 13A), and gear-coupled to the first gear 411 and the second gear 511 to be disposed to receive a driving force. In some embodiments, the first drive motor 410 and the second drive motor 510 may be simultaneously coupled in opposite directions of one gear (e.g., pinion gear).

According to various embodiments, the drive module 500 may include a motor FPCB 520 slid-out from the first drive motor 410 and the second drive motor 510. According to an embodiment, the motor FPCB 520 may include a first portion 521 electrically connected to the first drive motor 410, a second portion 522 extended from the first portion 521 and electrically connected to the second drive motor 510, and a third portion 523 branched to a designated length between the first portion 521 and the second portion 522. According to an embodiment, the third portion 523 may be electrically connected to a substrate (e.g., the substrate 250 of FIG. 12C) of the electronic device 200. According to an embodiment, the third portion 523 may be disposed in a manner of passing through at least a portion of the motor bracket 530.

Figure 14A:
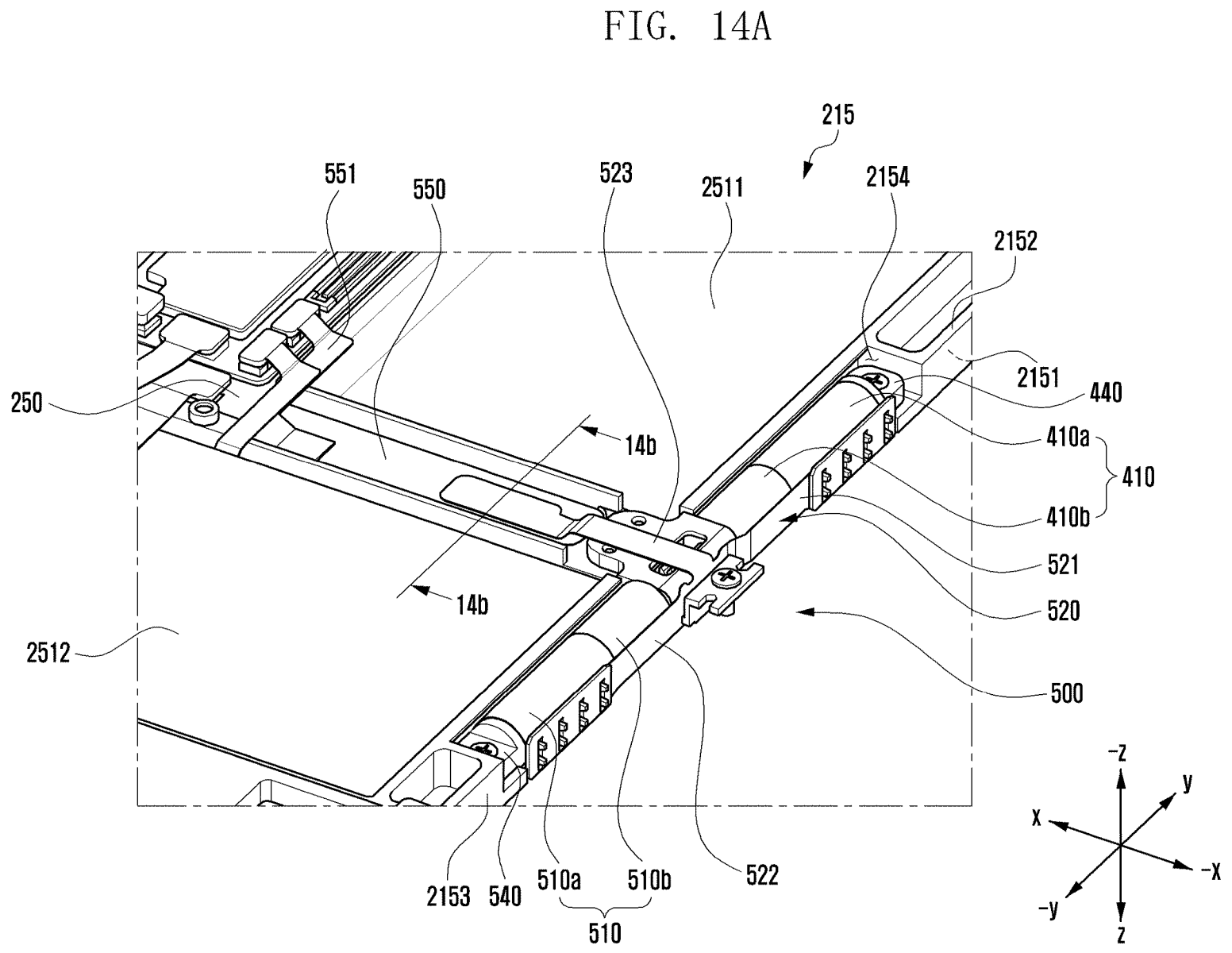
Figure 14B:
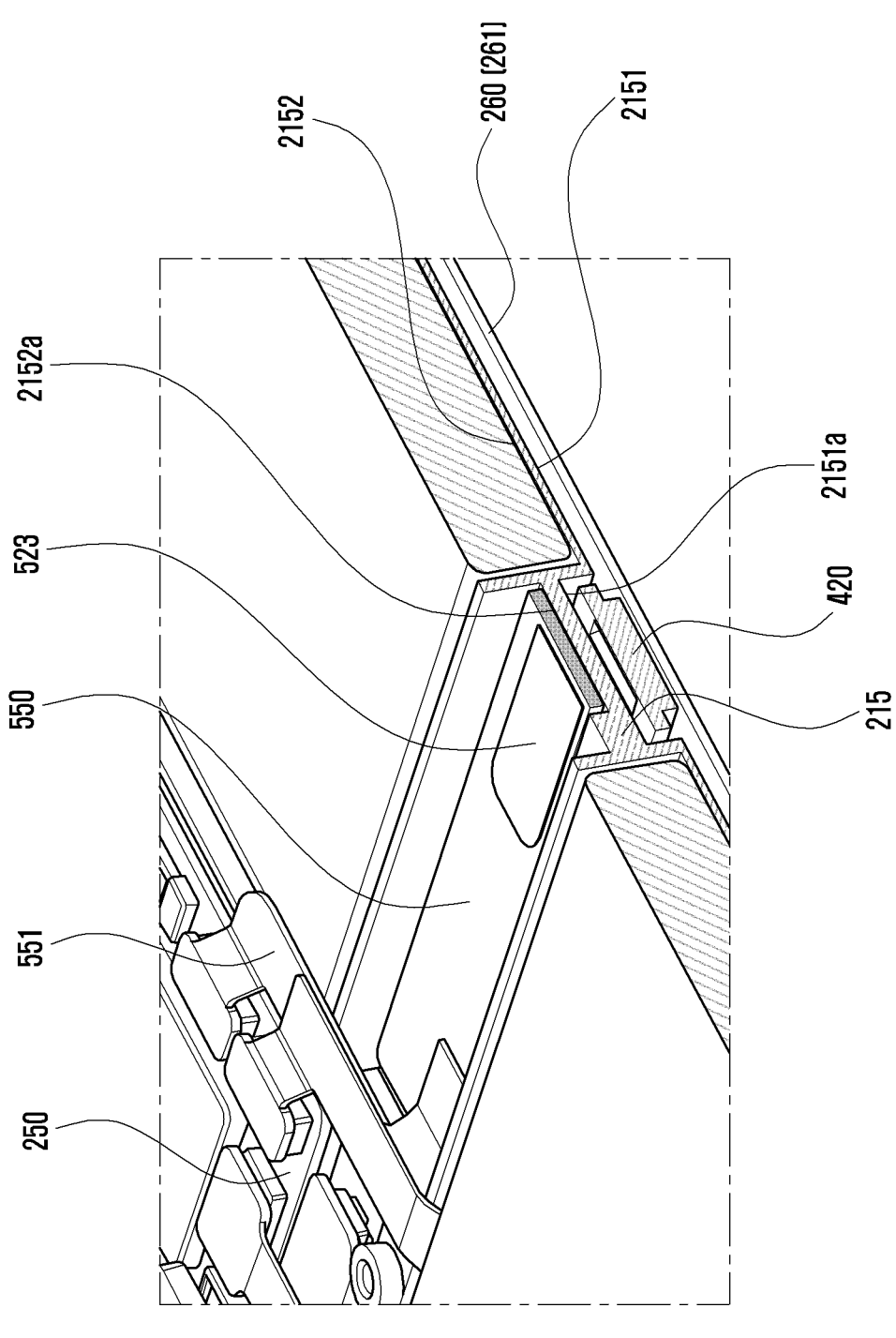
FIG. 14B is a partial cross-sectional perspective view illustrating a bracket housing viewed along line 14b-14b of FIG. 14A according to various embodiments of the disclosure.

FIG. 14A is a partial perspective view illustrating a bracket housing 215 in which a drive module 500 is disposed according to various embodiments of the disclosure. FIG. 14B is a partial cross-sectional perspective view illustrating a bracket housing 215 viewed along line 14*b*-14*b* of FIG. 14A according to various embodiments of the disclosure.

With reference to FIGS. 14A and 14B, the drive module 500 may be fixed to the bracket housing 215. According to an embodiment, the bracket housing 215 may include a first surface 2151, a second surface 2152 facing in a direction opposite to the first surface 2151, and a side surface 2153 enclosing a space between the first surface 2151 and the second surface 2152. According to an embodiment, the drive module 500 may be disposed at the side surface 2153 of the bracket housing 215 through the receiving part 2154 formed to be lower than the side surface 2153. For example, the first drive motor 410 may be fixed to the side surface 2153 of the bracket housing 215 through the first dummy bracket 440. According to an embodiment, the second drive motor 510 may be fixed to the receiving part 2154 provided at the side surface 2153 of the bracket housing 215 through the second dummy bracket 540. According to an embodiment, since the motor bracket 530 supports the first drive motor 410 and the second drive motor 510, the drive module 500 may be fixed to the bracket housing 215 by only a fixing structure of the first dummy bracket 440 and the second dummy bracket 540. In some embodiments, the motor bracket 530 may also be fixed to a side surface of the bracket housing 215.

According to various embodiments, the electronic device 200 may include an electrical connection structure for electrically connecting the drive module 500 and the substrate 250 of the electronic device 200, to each other. According to an embodiment, the electrical connection structure may include a motor PCB 550 electrically connected to the third portion 523 of the motor FPCB 520 and disposed at the second surface 2152 of the bracket housing 215, and a connector FPCB 551 for electrically connecting the motor PCB 550 and the substrate 250 of the electronic device 200.

According to an embodiment, the motor PCB 550 may include a motor driver IC and/or a DCDC IC. According to an embodiment, the motor PCB 550 may be electrically connected to the substrate 250 of the electronic device 200 disposed at the second surface 2152 of the bracket housing 215, through the connector FPCB 551. According to an embodiment, the motor PCB 550 may be disposed in a space between the first battery 2511 and the second battery 2512, at the second surface 2152 of the bracket housing 215, thereby helping to secure an efficient disposition structure. Each of the first surface 2151 and the second surface 2152 may include a recess at the space between the first battery 2511 and the second battery 2512, to define a first sub-surface 2151*a* and a second sub-surface 2152*a*, respectively.

According to various embodiments, the electronic device (e.g., the electronic device 200 of FIG. 5A) may include a first housing (e.g., the first housing 210 of FIG. 5A), a second housing (e.g., the second housing 220 of FIG. 5A) slidably coupled to the first housing, a flexible display (e.g., the flexible display 230 of FIG. 5A) expanded or contracted based on a sliding-out or slide-in movement of the first housing, a support member (e.g., the support member 240 of FIG. 5A) configured to support at least part of the flexible display and disposed at a rear surface of the flexible display, at least one drive motor (e.g., the drive motor 410 of FIG. 6A) disposed in the first housing and fixed by at least one bracket (e.g., the motor bracket 430 of FIG. 6A) and including a first gear 411, and a second gear (e.g., the second gear 421 of FIG. 6A) disposed in the second housing and disposed to engage with the first gear, where the first housing may be configured to slide-in or slide-out based on driving by engaging the first gear with the second gear, when the drive motor is driven.

The electronic device includes a housing including a first housing and a second housing which is slidably coupled to the first housing along a sliding direction, a flexible display fixed to the first housing and slidable along the second housing together with sliding of the second housing relative to the first housing, a visible area of the flexible display which is exposed outside of the housing, an area of the visible area changeable together with the sliding of the second housing relative to the first housing, and a driver including a drive motor including a first gear, the drive motor fixed to the first housing, and a second gear engaged with the first gear of the drive motor, the second gear being in the second housing, connected to the second housing, and slidable along the sliding direction relative the flexible display. Driving of the driver includes sliding of the second gear along the flexible display to change the visible area of the flexible display, together with the sliding of the second housing relative to the first housing.

The electronic device may further include a support member 240 in the second housing and extended along a rear surface of the flexible display, the support member slidable relative to the second housing and the second gear. The sliding of the second gear along the flexible display, in the direction away from the first housing, slides the support member along the second housing to support an expanded portion of the visible area.

The driving of the driver may further include the sliding of the second gear, in a direction away from the first housing, expanding the visible area of the flexible display and sliding the second housing out of the first housing (FIG. 5A to FIG. 5B), and the sliding of the second gear, in a direction toward the first housing, contracting the visible area of the flexible display and sliding the second housing into the first housing (FIG. 5B to FIG. 5A).

According to various embodiments, the second gear may be disposed in a gear support member, and the drive motor may be fixed in at least two different directions through the at least one bracket, and the gear support member may be slidably coupled to the at least one bracket.

According to various embodiments, the first housing may include a bracket housing (e.g., the bracket housing 215 of FIG. 4) including a first surface (e.g., the first surface 2151 of FIG. 4) facing the flexible display, a second surface (e.g., the second surface 2152 of FIG. 4) facing in a direction opposite to the first surface, and a side surface (e.g., the side surface 2153 of FIG. 4) enclosing a space between the first surface and the second surface in the slide-out state, where the at least one drive motor may be disposed at the side surface.

The driver may further include a motor bracket 430 slidably coupled with the second gear 420 along the sliding direction, the motor bracket fixed to the first housing along a first direction (X-axis direction in FIG. 8B, for example), the drive motor may be received in the motor bracket and fixed to the first housing in along the first direction, by the motor bracket, and the drive motor may be further fixed to the first housing along a second direction crossing the first direction (Z-axis direction in FIG. 8B, for example).

According to various embodiments, the at least one drive motor may be at least partially received in a receiving part (e.g., the receiving part 2154 of FIG. 8B) formed to be lower than the side surface at the side surface.

According to various embodiments, the at least one drive motor may be disposed not to be higher than the first surface and/or the second surface in the receiving part.

According to various embodiments, the at least one bracket may include a motor bracket (e.g., the motor bracket 430 of FIG. 6A) coupled to one end of the at least one drive motor and configured to receive the first gear, and a dummy bracket (e.g., the dummy bracket 440 of FIG. 6A) coupled to the other end of the drive motor.

Referring to FIG. 8B, for example, the first housing includes a first surface 2151 overlapping the flexible display, a second surface 2152 opposite to the first surface along a thickness direction of the first housing (e.g., Z-axis direction), and a side surface 2153 connecting the first surface and the second surface to each other, where the drive motor 400 is fixed to the first housing at the side surface. The first housing defines a receiving groove 2154 recessed from the side surface 2153, along the sliding direction (X-axis direction), and the drive motor 400 is received in the receiving groove 2154. The receiving groove is further recessed from a respective surface among the first surface and the second surface of the first housing, and the drive motor which is received in the receiving groove 2154 does not extend further than the respective surface (2152 in FIG. 8B, for example). A dummy bracket 440 may be spaced apart from the motor bracket 430, along the drive motor (Y-axis direction). The drive motor is received in the motor bracket 430, at a first end portion of the drive motor (−Y-axis direction), and the drive motor is fixed to the first housing at a second end portion of the drive motor which is opposite to the first end portion, by the dummy bracket (+Y-axis direction).

According to various embodiments, the motor bracket may include a body (e.g., the body 431 of FIG. 6A) coupled to the at least one drive motor and the first gear, and a fixing part (e.g., the fixing part 435 of FIG. 6A) extended from the body, where the fixing part may be fixed through a fastening member (e.g., the fastening member S of FIG. 8B) fastened in the first direction at a first stepped part (e.g., the first stepped part 2155 of FIG. 8B) formed to be lower than the side surface.

According to various embodiments, the dummy bracket may be fixed through a fastening member fastened in a second direction perpendicular to the first direction at a second stepped part (e.g., the second stepped part 2156 of FIG. 8B) formed to be lower than the first surface.

According to various embodiments, the body may include a space (e.g., the space 432 of FIG. 6A) for receiving the first gear, and be rotatably disposed through a shaft (e.g., the shaft 4111 of FIG. 6A) penetrating a first through hole (e.g., the first through hole 433a of FIG. 6A) and a second through hole (e.g., the second through hole 433b of FIG. 6A) formed at left and right sides based on the space.

According to various embodiments, the electronic device may include an opening (e.g., the opening 434 of FIG. 6A) formed through the space and configured to protrude at least a portion of the first gear to the outside of the motor bracket, where at least a portion of the first gear protruded through the opening may be gear-coupled to the second gear of the gear support member.

The motor bracket includes a body 431 which receives the first end portion of the drive motor and the first gear, and a fixing part 435 which is extended from the body, the first housing defines a first stepped part 2155 recessed from the side surface, the fixing part of the motor bracket is received in the first stepped part 2155 of the first housing and fixed to the first housing at the first stepped part by a fastening member fastened to the first housing along a first direction (X-axis direction). The fixing part which is received in the first stepped part does not extend further than the side surface of the first housing, along a first direction. The first housing defines a second stepped part 2156 recessed from the side surface and from the first surface of the first housing, the dummy bracket 440 is received in the second stepped part of the first housing and fixed to the first housing at the second stepped part by a fastening member fastened to the first housing along a second direction crossing the first direction (Z-axis direction). The dummy bracket which is received in the second stepped part does not extend further than the first surface of the first housing, along the second direction.

The body of the motor bracket defines an opening 432 in the motor bracket, and a first through hole 433*a* and a second through hole 433*b* which are at opposing sides of the opening, along the drive motor, and in communication with the opening. The drive motor further includes a shaft 4111 which is connected to the first gear and rotatable together with the first gear, the shaft penetrating the first through hole and the second through hole in the body of the motor bracket. The first gear of the drive motor protrudes out of the motor bracket, at the opening, and defines a protruded gear portion, and the second gear is gear-coupled to the protruded gear portion of the first gear.

According to various embodiments, the gear support member may be slidably coupled to a guide groove (e.g., the guide groove 436 of FIG. 6E) formed in the body.

According to various embodiments, the electronic device may further include a friction reduction structure disposed between the gear support member and the guide groove.

According to various embodiments, the electronic device may further include an auxiliary cover (e.g., the auxiliary cover 215*a* of FIG. 11C) disposed at the first surface and at least partially including a receiving hole (e.g., the receiving hole 215*b* of FIG. 11C) between the bracket housing and the flexible display, where at least a portion of the drive motor may be disposed to be received in at least a portion of the receiving hole.

According to various embodiments, the second gear may be formed through a plurality of through holes (e.g., the through holes 422 of FIG. 9B) formed at predetermined intervals in the gear support member, and the gear support member may be disposed to be supported through at least a portion (e.g., the support 2611 of FIG. 9A) of the second housing.

According to various embodiments, the at least one drive motor may include a first drive motor (e.g., the first drive motor 410 of FIG. 14A) and a second drive motor (e.g., the second drive motor 510 of FIG. 14A) disposed with the at least one bracket interposed therebetween, where the first drive motor and the second drive motor may be disposed in parallel along a rotation axis.

According to various embodiments, the second gear of the gear support member may simultaneously receive a driving force of the first drive motor and the second drive motor.

The electronic device may further include a sliding plate 260 connected to the second gear and extended along a rear surface of the flexible display, the sliding plate slidable together with the second gear, relative to the second housing. The second gear extends along the guide groove and further than the motor bracket to define an extended portion of the second gear (L-shaped portion in −X-axis direction). The sliding plate defines a recess 2621 which receives the extended portion of the second gear (FIG. 10B, for example), the second gear fixed to the sliding plate at the recess.

According to various embodiments, an electronic device may include a first housing, a second housing slidably coupled to the first housing, a flexible display configured to expand or contract based on a sliding-out or slide-in movement of the first housing, a support member configured to support at least a portion of the flexible display and disposed at a rear surface of the flexible display, at least one drive motor disposed in the first housing and fixed by at least one bracket, and including a first gear, and a gear support member disposed in the second housing and including a second gear disposed to engage with the first gear, where the drive motor may be fixed in at least two different directions through the at least one bracket, and the gear support member may be slidably coupled to the at least one bracket.

That is, the driver includes a bracket, a drive motor which includes a first gear, the drive motor fixed to the first housing by the bracket, and a second gear in the second housing and connected to the second housing, the second gear slidably coupled to the bracket along the sliding direction and engaged with the first gear. The bracket is fixed to the first housing in a first fastening direction through the bracket and a second fastening direction through the bracket which crosses the first fastening direction, to restrict movement of the drive motor in the first fastening direction and the second fastening direction, respectively.

The first housing may include an upper housing and a lower housing which faces the upper housing, the visible area is defined between an inner side surface of the upper housing and an inner side surface of the second housing, along the sliding direction, and the drive motor is coplanar with the inner side surface of the upper housing.

According to various embodiments, an electronic device may include a first housing including a first space, a second housing slidably coupled to the first housing and including a second space connected to the first space, a flexible display connected to the first housing according to a sliding movement of the second housing, and having a slide-in state at least partially received in the second space or a slide-out state at least partially withdrawn from the second space, and a drive motor disposed in at least a portion of a first section in which a portion visible from the outside of the flexible display and a portion entered into the second space and invisible from the outside are overlapped and configured to drive the second housing to be slidable from the first housing, when the flexible display is viewed from above, in the slide-in state.

According to various embodiments, the first gear may include a pinion gear rotatably coupled through the at least one drive motor, and the second gear may include a rack gear formed in the gear support member and gear-coupled to the pinion gear.

According to various embodiments, an electronic device (e.g., the electronic device 200 of FIG. 5A) may include a first housing (e.g., the first housing 210 of FIG. 5A) including a first space (e.g., the first space 2101 of FIG. 5A), a second housing (e.g., the second housing 220 of FIG. 5A) slidably coupled to the first housing and including a second space (e.g., the second space 2201 of FIG. 5A), a flexible display (e.g., the flexible display 230 of FIG. 5A) connected to the first housing and having a slide-in state at least partially received in the second space or a slide-out state at least partially slid-out from the second space according to a sliding movement of the second housing, and a drive motor (e.g., the drive motor 410 of FIG. 5A) disposed in at least a portion of a first section in which a portion visible from the outside of the flexible display and a portion slid-in in the second space to be invisible from the outside are overlapped and configured to drive the second housing to be slidable from the first housing, when the flexible display is viewed from above, in the slide-in state.

Here, a housing including a first housing defining a first space, and a second housing which is slidably coupled to the first housing and defines a second space connected to the first space to define an inner space of the housing, a flexible display fixed to the first housing and slidable along the second housing, a visible area of the flexible display which is exposed outside of the housing and a non-visible area of the flexible display which extends from the visible area, an area of the visible area and the non-visible area changeable together with the sliding of the second housing relative to the first housing, and a drive motor which is in the inner space of the housing, is connected to the first housing and the second housing and drives sliding of the second housing relative to the first housing. The housing having the second housing slid into the first space of the first housing by driving of the drive motor, includes the visible area of the flexible display overlapping the non-visible area of the flexible display together with the drive motor being between the visible area and the non-visible area which are over-lapped with each other.

According to various embodiments, in the slide-in state, when the flexible display is viewed from above, the electronic device may further include a second section in which a portion visible from the outside of the flexible display and a portion slid-in at the second space of the second housing to be invisible from the outside are not overlapped, and include a bracket housing including a first surface facing the flexible display, a second surface facing in a direction opposite to the first surface, and a side surface enclosing a space between the first surface and the second surface in the slide-out state, and the drive motor may be disposed at the side surface.

According to various embodiments, the electronic device may include a drive module configured to slidably move the second housing from the first housing, where the drive module may include a drive motor fixed through at least one bracket in the first space and including a first gear, and a gear support member including a second gear disposed to be gear-coupled to the first gear in the second space, where the drive motor may be fixed in at least two different directions through the at least one bracket, and the gear support member may be coupled through the at least one bracket.

According to various embodiments, the first gear may include a pinion gear rotatably coupled through the at least one drive motor, and the second gear may include a rack gear formed in the gear support member and gear-coupled to the pinion gear.

The embodiments of the disclosure disclosed in this specification and the drawings merely present specific examples in order to easily describe the technical contents according to embodiments of the disclosure and to help understanding of the embodiments of the disclosure, and they are not intended to limit the scope of the embodiments of the disclosure. Therefore, all changes or modified forms derived based on the technical idea of various embodiments of the disclosure in addition to the embodiments disclosed herein should be construed as being included in the scope of various embodiments of the disclosure.

What is claimed is:

1. An electronic device, comprising:
a first housing;
a second housing configured to move with respect to the first housing between a slide-in state and a slide-out state;
a flexible display, a visible portion of which expands or contracts based on a movement of the second housing with respect to the first housing;

a support member configured to support at least a portion of the flexible display and disposed at a rear surface of the flexible display;
at least one drive motor disposed in the first housing, fixed by at least one bracket, and including a first gear;
the at least one bracket fastened to the first housing in two fastening directions to restrict movement of the at least one drive motor; and
a second gear connected to the second housing and disposed to engage with the first gear,
wherein the second housing is configured to move with respect to the first housing based on the first gear and the second gear being driven when engaged with each other when the drive motor is driven.

2. The electronic device of claim 1, wherein the second gear is disposed in a gear support member, and
the gear support member is slidably coupled to the at least one bracket.

3. The electronic device of claim 1, wherein
the first housing comprises a bracket housing including a first surface facing the flexible display in the slide-out state, a second surface facing in a direction opposite to the first surface, and a side surface enclosing a space between the first surface and the second surface, and
the at least one drive motor is disposed at the side surface.

4. The electronic device of claim 3, wherein the at least one drive motor is at least partially received in a receiving part formed to be lower than the side surface at the side surface.

5. The electronic device of claim 4, wherein the at least one drive motor is disposed not higher than the first surface and/or the second surface in the receiving part.

6. The electronic device of claim 3, wherein the at least one bracket comprises a motor bracket coupled to one end of the at least one drive motor and configured to receive the first gear, and a dummy bracket coupled to the other end of the drive motor.

7. The electronic device of claim 6, wherein
the motor bracket comprises a body coupled to the at least one drive motor and the first gear, and a fixing part extended from the body, and
the fixing part is fixed through a fastening member fastened in a first direction among the two fastening directions, in a first stepped part formed to be lower than the side surface.

8. The electronic device of claim 7, wherein the dummy bracket is fixed through a fastening member fastened in a second direction among the two fastening directions which is perpendicular to the first direction, in a second stepped part formed to be lower than the first surface.

9. The electronic device of claim 7, wherein the body comprises a space configured to receive the first gear, and is rotatably disposed through a shaft configured to penetrate a first through hole and a second through hole formed at left and right sides based on the space.

10. The electronic device of claim 9, further comprising an opening formed through the space and configured to protrude at least a portion of the first gear to the outside of the motor bracket,
wherein at least a portion of the first gear protruded through the opening is gear-coupled to the second gear.

11. The electronic device of claim 10, wherein the gear support member is slidably coupled to a guide groove formed in the body.

12. The electronic device of claim 11, further comprising a friction reduction structure disposed between the gear support member and the guide groove.

13. The electronic device of claim 3, further comprising an auxiliary cover disposed at the first surface between the bracket housing and the flexible display and at least partially including a receiving hole, wherein at least a portion of the drive motor is disposed to be received in at least a portion of the receiving hole.

14. The electronic device of claim 1, wherein the at least one drive motor includes a first drive motor and a second drive motor disposed with the at least one bracket interposed therebetween.

15. The electronic device of claim 14, wherein the first drive motor and the second drive motor are disposed in parallel along a rotation axis.

16. The electronic device of claim 14, wherein the second gear simultaneously receives a driving force of the first drive motor and the second drive motor.

17. An electronic device, comprising:

a first housing;

a second housing configured to move with respect to the first housing between a slide-in state and a slide-out state;

a flexible display, a visible portion of which expands or contracts based on movement of the second housing with respect to the first housing;

a support member configured to support at least a portion of the flexible display and disposed at a rear surface of the flexible display;

at least one drive motor disposed in the first housing, fixed by at least one bracket, and including a first gear; and a gear support member disposed in the second housing and including a second gear disposed to engage with the first gear, wherein the drive motor is fixed to the first housing through the at least one bracket fastened to the first housing in at least two different fastening directions, and the gear support member is slidably coupled to the at least one bracket.

18. The electronic device of claim 17, wherein the at least one drive motor includes a first drive motor and a second drive motor disposed with the at least one bracket interposed therebetween.

19. The electronic device of claim 18, wherein the first drive motor and the second drive motor are disposed in parallel along a rotation axis.

20. An electronic device, comprising:

a first housing including a first space;

a second housing slidably coupled to the first housing and including a second space connected to the first space;

a flexible display connected to the first housing according to a sliding movement of the second housing and having a slide-in state at least partially received in the second space or a slide-out state at least partially withdrawn from the second space; and a drive motor disposed in at least a portion of a first section in which a portion visible from the outside of the flexible display and a portion entered into the second space to be invisible from the outside are overlapped, when the flexible display is viewed from above, in the slide-in state, and configured to drive the second housing to be slidable from the first housing, wherein the drive motor is fixed to the first housing by at least one bracket fastened to the first housing in two different fastening directions.

\* \* \* \* \*